US 8,975,894 B2

(12) United States Patent
Lee

(10) Patent No.: US 8,975,894 B2
(45) Date of Patent: Mar. 10, 2015

(54) MAGNETIC RESONANCE IMAGING APPARATUS

(71) Applicant: Samsung Electronics Co., Ltd., Suwon-si (KR)

(72) Inventor: Myung-kyu Lee, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/071,824

(22) Filed: Nov. 5, 2013

(65) Prior Publication Data

US 2014/0125337 A1  May 8, 2014

(30) Foreign Application Priority Data

Nov. 5, 2012 (KR) .......... 10-2012-0124471
May 22, 2013 (KR) .......... 10-2013-0057952

(51) Int. Cl.
H04N 9/31 (2006.01)
G01R 33/48 (2006.01)
G01R 33/28 (2006.01)

(52) U.S. Cl.
CPC .............. *H04N 9/312* (2013.01); *G01R 33/283* (2013.01); *G01R 33/48* (2013.01)
USPC ........... 324/309; 324/307; 324/318; 324/321; 348/744

(58) Field of Classification Search
CPC ........... G01R 33/283; G01R 33/34007; G01R 33/3642
USPC ............................. 324/300–322; 248/323–324
See application file for complete search history.

(56) References Cited

U.S. PATENT DOCUMENTS

| | | | |
|---|---|---|---|
| 6,774,929 B1 * | 8/2004 | Kopp | 348/61 |
| 2005/0035253 A1 * | 2/2005 | Rixom | 248/284.1 |
| 2005/0283068 A1 * | 12/2005 | Zuccolotto et al. | 600/410 |
| 2008/0200796 A1 | 8/2008 | Graham et al. | |
| 2008/0281186 A1 * | 11/2008 | Kuhara | 600/413 |
| 2009/0154647 A1 | 6/2009 | Matsuzawa et al. | |
| 2010/0201956 A1 * | 8/2010 | Kimura | 353/85 |
| 2010/0208434 A1 * | 8/2010 | Kim et al. | 361/729 |
| 2011/0080335 A1 * | 4/2011 | Unger et al. | 345/156 |
| 2011/0218424 A1 * | 9/2011 | Kuhara | 600/413 |
| 2013/0208249 A1 * | 8/2013 | Kimmlingen | 353/30 |
| 2013/0218004 A1 * | 8/2013 | Yang | 600/415 |

FOREIGN PATENT DOCUMENTS

| | | |
|---|---|---|
| JP | 2003-190112 A | 7/2003 |
| JP | 2004-180834 A | 7/2004 |
| JP | 2009160390 A | 7/2009 |

(Continued)

OTHER PUBLICATIONS

Machine translation of JP2011-056121.*

(Continued)

*Primary Examiner* — Melissa Koval
*Assistant Examiner* — Rishi Patel
(74) *Attorney, Agent, or Firm* — Sughrue Mion, PLLC

(57) ABSTRACT

A magnetic resonance imaging (MRI) apparatus includes a housing which has a bore to which a magnetic field for use in an MRI scan is applied, a moving table on which an inspection target may be placed and that enters the bore of the housing, a projector which projects an image onto an inner wall that forms the bore of the housing, and a controller which controls the projection unit and transmits a video signal to the projector.

30 Claims, 14 Drawing Sheets

(56) References Cited

FOREIGN PATENT DOCUMENTS

| JP | 2011-56121 A | 3/2011 |
| KR | 10-2010-0101482 A | 9/2010 |

OTHER PUBLICATIONS

Machine translation of JP2009-160390.*

International Search Report dated Feb. 27, 2014 issued in International Application No. PCT/KR2013/009725 (PCT/ISA/210).

Written Opinion dated Feb. 27, 2014 issued in International Application No. PCT/KR2013/009725 (PCT/ISA/220/237).

Communication dated Jul. 23, 2014, issued by the Korean Intellectual Property Office in counterpart Korean Application No. 10-2013-0057952.

* cited by examiner

MAGNETIC RESONANCE IMAGING APPARATUS

CROSS-REFERENCE TO RELATED PATENT APPLICATIONS

This application claims priority from Korean Patent Application No. 10-2012-0124471, filed on Nov. 5, 2012 in the Korean Intellectual Property Office, and from Korean Patent Application No. 10-2013-0057952, filed on May 22, 2013 in the Korean Intellectual Property Office, the disclosures of which are incorporated herein by reference in their respective entireties.

BACKGROUND

1. Field

Exemplary embodiments relate to magnetic resonance imaging (MRI) apparatuses, and more particularly, to an MRI apparatus which is capable of displaying an image within a bore of the MRI apparatus.

2. Description of the Related Art

Magnetic resonance imaging (MRI) apparatuses are imaging apparatuses which are used for performing a medical diagnosis and that visualize the cross-sections of internal structures of a human body. An MRI apparatus includes a main magnet which is used to apply a strong magnetic field to a human body, a gradient coil which is used to apply a gradient magnetic field in order to provide location information of a magnetic field, and a radio frequency (RF) coil which is used to apply electromagnetic waves to a human body so that a magnetization vector resonates within the human body and to receive a magnetic resonance signal from the human body. The main magnet, the gradient coil, and the RF coil used for performing an MRI scanning are accommodated in a housing, which is a cylindrically shaped structure which has a bore in which an inspection target lies.

However, during an MRI scanning, because the bore of an MRI apparatus where an inspection target lies is a relatively narrow and enclosed space, the inspection target is highly likely to feel bored and thus move during a long scan. When an inspection target moves frequently, an image which is obtained via an MRI scan may have a low quality, and thus content for reducing the boredom of the inspection target during scanning needs to be provided. To this end, a virtualization system that provides video data to an inspection target during an MRI scan has been proposed. As an example of the virtualization system, there has been proposed a method for providing video data to an inspection target by allowing the inspection target to wear glasses on which an image is displayed, or by allowing the inspection target to see an image which is displayed outside the housing via a mirror installed within the bore. However, the glasses-wearing method may cause inconvenience to an inspection target due to the closeness of glasses on which an image is displayed, and the mirror-using method may degrade the quality of an image.

SUMMARY

Exemplary embodiments provide a magnetic resonance imaging (MRI) apparatus which is capable of displaying an image within a bore of the MRI apparatus while reducing the inconvenience of an inspection target.

According to an aspect of one or more exemplary embodiments, there is provided an MRI apparatus including a housing which includes a bore which is configured to receive an applied magnetic field for use in an MRI scan; a moving table which is configured to provide for a placement of an inspection target and to enter the bore of the housing; a projector which is configured to project an image onto an inner wall of the housing which at least partially forms the bore of the housing; and a controller which is configured to control the projector and to transmit a video signal to the projector.

The inner wall of the housing may be curved into a substantially cylindrical formation. The substantially cylindrical formation denotes not only an entirely-cylindrical structure but also a partially-cylindrical structure. Alternatively, at least a part of the inner wall of the housing may be flat, and the projector may be further configured to project an image onto the flat at least the part of the inner wall.

The MRI apparatus may further include a correction processor which is configured to process a signal which relates to the image that is to be projected by the projector, such that a distortion of the image due to a curvature and/or a slanting of the inner wall of the housing is substantially offset as a result of the signal processing. The distortion may include a curved surface distortion due to the curve of the inner wall of the housing or a skew distortion due to an aslant image projection. The offsetting may be a preceding distortion because it is generated beforehand to offset the curved surface distortion or the skew distortion. The correction processor may be further configured to adjust an amount of the offset which results from the signal processing based on a change in a direction in which the projector projects the image.

The projector may include a projection direction converter which is configured to convert a direction in which the projector projects the image.

The projector may include a driving module which is configured to apply a driving force to the projection direction converter such that the direction in which the projector projects the image is changed. The controller may be further configured to control the driving module such that the direction in which the projector projects the image is changed based on at least one from among a posture and a facing direction of the inspection target which corresponds to a user manipulation.

The projector may include a driving module which is configured to apply a driving force to the projection direction converter such that the direction in which the projector projects the image is changed, and a location tracking sensor which is configured to sense at least one from among a posture and a facing direction of the inspection target. The controller may be further configured to control the driving module such that the direction in which the projector projects the image is changed based on the at least one from among the posture and the facing direction of the inspection target that is sensed by the location tracking sensor.

A location on the inner wall of the housing at which the image is projected may change based on a location of the moving table within the bore of the housing when the moving table enters the bore of the housing.

The projector may include an illumination sensor which is configured to control a beam brightness of the image which is projected by the projector based on a state of an illuminance within the bore.

At least a part of the projector may be mounted on the moving table.

The projector may include a beam projector which is disposed on at least one end of the moving table with respect to a longitudinal direction of the moving table.

The projector may further include a detachable module which is mounted on the moving table and to which the beam projector is detachably coupled.

The detachable module may include a first detachable submodule and a second detachable submodule, wherein the first detachable submodule is disposed on a first end of the moving table with respect to the longitudinal direction and the second detachable submodule is disposed on a second end of the moving table which is opposite to the first end of the moving table with respect to the longitudinal direction.

Each of the first detachable submodule and the second detachable submodule may include a respective connection terminal which is configured to transmit power and a video signal which is received from the controller to the beam projector, and a respective detachable sensor which is configured to sense an attachment or a detachment of the beam projector. The controller may be further configured to supply the power and the video signal to only a submodule to which the beam projector is attached from among the first detachable submodule and the second detachable submodule, based on respective information which relates to the respective attachment or the respective detachment of the beam projector sensed by each respective detachable sensor.

The detachable module may include a projection direction converter which is configured to convert a direction in which the projector projects the image.

The beam projector may include an optical engine module which is configured to project an image, wherein the projection direction converter is further configured to convert a direction in which the optical engine module projects the image.

The beam projector may include an illuminance sensor which is configured to control a brightness of a beam of the beam projector based on a state of an illuminance within the bore.

The beam projector may include a light source driver which is configured to supply a constant voltage power having a constant level to a light source. The light source driver may include an adjustable regulator which is configured to transform an input power into a preset constant voltage and to output the preset constant voltage, the adjustable regulator comprising no inductors; a constant voltage controller which is configured to control an outputting of the constant voltage power which corresponds to the preset constant voltage output by the adjustable regulator; and a current sensor which is configured to sense a current supplied to the light source and to transmit information which relates to a magnitude of the sensed current to the constant voltage controller.

The beam projector may further include a heat dissipation module which is configured to dissipate generated heat. The heat dissipation module may include a heat sink which is formed of a non-magnetic material.

The projector may include a beam projector which is installed outside of the bore of the housing, and a reflection mirror which is configured to reflect a light beam of an image projected by the beam projector onto the inner wall of the housing.

The beam projector may be configured to project a collimated light beam.

The reflection mirror may have an aspherical reflection surface or a flat panel type reflection surface, which surface is configured to magnify the light beam projected by the beam projector to have a wide angle.

The MRI apparatus may further include a support which is configured to movably support the moving table, and the beam projector may be disposed on the support.

The MRI apparatus may further include a beam projector detachable module which is mounted on the moving table and to which the beam projector is detachably coupled.

The beam projector detachable module may include a first detachable submodule and a second detachable submodule, wherein the first detachable submodule is disposed on a first end of the support with respect to the longitudinal direction and the second detachable submodule is disposed on a second end of the support which is opposite to the first end of the support with respect to the longitudinal direction.

The reflection mirror may be disposed on the moving table.

The projector may further include a reflection mirror detachable device which is disposed on the moving table, and via which the reflection mirror is detachably coupled to the moving table; and a beam projector detachable module which is mounted on a support which is configured for movably supporting the moving table and to which the beam projector is detachably coupled.

The reflection mirror detachable device may include a first detachable device and a second detachable device which are respectively disposed on both opposite ends of the moving table with respect to the longitudinal direction. The beam projector detachable module may include a first detachable submodule and a second detachable submodule which are respectively disposed on both opposite ends of the support with respect to the longitudinal direction.

The reflection mirror may be disposed within the bore of the housing.

The projector may include an optical fiber projector, the optical fiber objector including a video unit which is disposed outside of the bore of the housing, an optical fiber cable unit which is configured to transmit a light beam of an image produced by the video unit, and a projection lens unit which is configured to project the light beam of the image received via the optical fiber cable unit onto the inner wall that at least partially forms the bore of the housing.

The projection lens unit may be disposed on the moving table.

The projector may further include a projection lens unit detachable device which is disposed on at least one of both opposite ends of the moving table with respect to the longitudinal direction, and to which the projection lens unit is detachably coupled; and a video unit detachable module which is installed on a support which is configured for movably supporting the moving table and to which the video unit detachably attaches.

The projection lens unit detachable device may include a first detachable device and a second detachable device which are respectively disposed on both ends of the moving table. The video unit detachable module may include a first detachable submodule and a second detachable submodule which are respectively disposed on both opposite ends of the support with respect to the longitudinal direction.

The image that is projected may include at least one of an MRI scan image, scan information, and moving picture contents.

According to another aspect of one or more exemplary embodiments, there is provided a method for displaying an image within a bore of an MRI apparatus, the method including causing a moving table on which an inspection target lies to enter into a bore of a housing to which a magnetic field for use in an MRI scan is applied; and projecting an image onto an inner wall of the housing, which inner wall at least partially forms the bore of the housing.

The method may further include offsetting a distortion of the projected image which distortion is due to a curvature and/or a slanting of the inner wall of the housing by performing signal processing with respect to a signal which relates to the image.

The method may further include changing a direction in which an image is projected onto the inner wall of the housing, and adjusting an amount of the offsetting based on the changing the direction in which the image is projected.

The projecting the image onto the inner wall of the housing may include starting the projecting at a point of time when the moving table enters the bore of the housing. Alternatively, the projecting the image onto the inner wall of the housing may include starting the projecting at a point of time when a head of the inspection target enters the bore of the housing.

A point of time when the image is projected onto the inner wall of the housing may vary with respect to a selection between a first arrangement in which a head of the inspection target is oriented towards the bore of the housing and a second arrangement in which legs of the inspection target are oriented towards the bore of the housing. For example, with respect to the first arrangement, image projection onto the inner wall of the housing may start at the moment when the head of the inspection target enters the bore of the housing. With respect to the second arrangement, image projection onto the inner wall of the housing may start at the moment when the neck of the inspection target enters the bore of the housing.

The method may further include changing a direction in which the image is projected, based on at least one from among a posture and a facing direction of the inspection target.

A location on the inner wall of the housing at which the image is projected may change based on a location of the moving table within the bore of the housing when the moving table enters the bore of the housing.

A beam brightness of the projected image may be controllable based on a state of an illuminance within the bore.

The projecting the image onto the inner wall may include mounting a beam projector on the moving table; and projecting the image onto the inner wall of the housing by driving the beam projector when the moving table enters the bore of the housing.

The projecting the image onto the inner wall may include disposing a beam projector outside of the bore of the housing; mounting a reflection mirror on the moving table; and projecting the image onto the reflection mirror so that the image is reflected toward the inner wall of the housing, by driving the beam projector when the moving table enters the bore of the housing.

The beam projector may project a collimated light beam.

The projecting the image onto the inner wall may include disposing a video unit outside of the bore of the housing; mounting, on the moving table, a projection lens unit that is connected to the video unit via an optical fiber cable unit; and transmitting an image to the projection lens unit via the optical fiber cable by driving the beam projector when the moving table enters the bore of the housing, and projecting the received image onto the inner wall of the housing by using the projection lens unit.

BRIEF DESCRIPTION OF THE DRAWINGS

The above and other features and advantages of the present inventive concept will become more apparent by describing in detail exemplary embodiments thereof with reference to the attached drawings in which.

DETAILED DESCRIPTION

Figure 1:
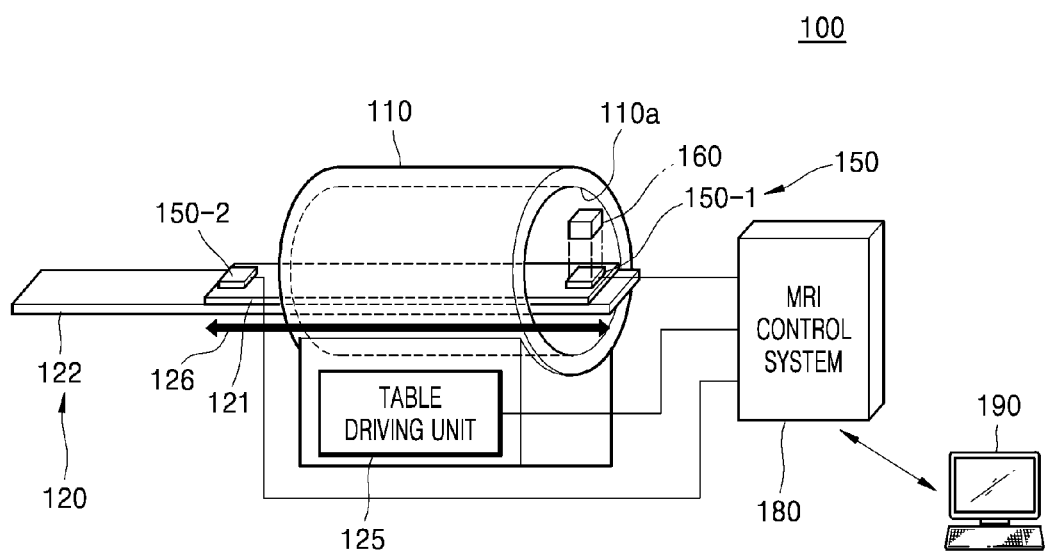
FIG. 1 is a schematic diagram of a magnetic resonance imaging (MRI) apparatus, according to an exemplary embodiment.

The present inventive concept will now be described more fully with reference to the accompanying drawings, in which exemplary embodiments are shown. The present inventive concept may, however, be embodied in many different forms and should not be construed as being limited to the exemplary embodiments set forth herein; rather, these exemplary embodiments are provided so that this disclosure will be thorough and complete, and will fully convey the concept to those skilled in the art. The scope of the present inventive concept is only defined in the claims. Throughout the specification, like reference numerals or characters refer to like elements.

The terminology used herein will now be briefly described as the exemplary embodiments will be described in detail based on this terminology.

Although general terms widely used at present were selected for describing the exemplary embodiments in consideration of the functions thereof, these general terms may vary according to intentions of one of ordinary skill in the art, case precedents, the advent of new technologies, and the like. Terms arbitrarily selected by the applicant may also be used in a specific case. In this case, their meanings need to be given in the detailed description. Hence, the terms must be defined based on their meanings and the contents of the entire specification, not by simply stating the terms.

The terms "comprises" and/or "comprising" or "includes" and/or "including", when used in this specification, specify the presence of stated elements, but do not preclude the presence or addition of one or more other elements.

The term "~unit" or "~er" as used herein means, but is not limited to, a software or hardware component, such as a field-programmable gate array (FPGA) or an application-specific integrated circuit (ASIC), which performs certain tasks. However, the term "~unit" or "~er" is not limited to software or hardware, but may be configured to reside on an addressable storage medium and configured to execute one or more processors. Thus, the term "~unit" or "~er" may include, by way of example, object-oriented software components, class components, and task components, and processes, functions, attributes, procedures, subroutines, segments of a program code, drivers, firmware, a micro code, a circuit, data, a database, data structures, tables, arrays, and variables. Functions provided by components and units may be combined into a smaller number of components and units, or may be further separated into additional components and units.

Exemplary embodiments are described in detail herein with reference to the accompanying drawings so that this disclosure may be easily performed by one of ordinary skill in the art to which the exemplary embodiments pertain. The present inventive concept may, however, be embodied in many different forms and should not be construed as being limited to the exemplary embodiments set forth herein. In the drawings, parts irrelevant to the description are omitted for simplicity of explanation.

Expressions such as "at least one of," when preceding a list of elements, modify the entire list of elements and do not modify the individual elements of the list.

In the entire specification, a "user" may be a medical expert, such as a doctor, a nurse, a health care technician, or a medical imaging expert, or may be an engineer who manages medical appliances; however, the exemplary embodiments are not limited thereto.

Figure 2:
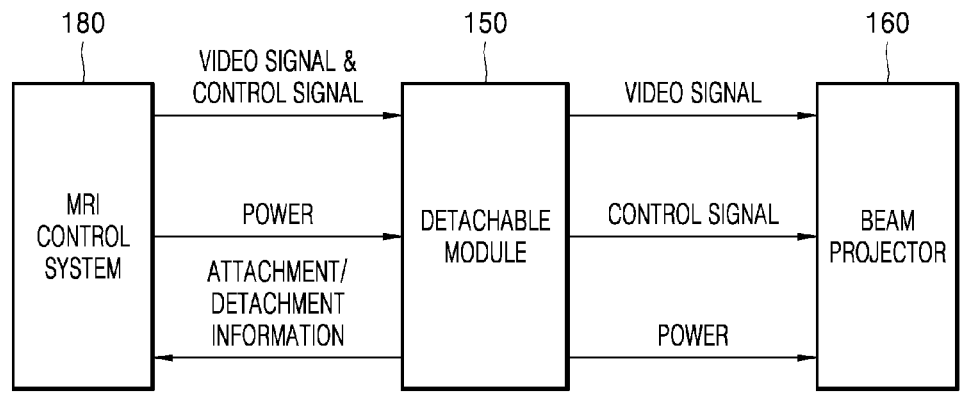
FIG. 2 is a block diagram of an in-bore display device of the MRI apparatus of FIG. 1, according to an exemplary embodiment.

FIG. 1 is a schematic diagram of a magnetic resonance imaging (MRI) apparatus 100, according to an exemplary embodiment. FIG. 2 is a block diagram of an in-bore display device of the MRI apparatus 100 of FIG. 1, according to an exemplary embodiment.

Referring to FIGS. 1 and 2, the MRI apparatus 100 includes a magnetic field generation unit (not shown) for performing an MRI which is installed within a housing 110, and an MRI control system 180 which applies power to the magnetic field generation unit and controls the magnetic field generation unit. The MRI apparatus 100 enables a user to manipulate the MRI control system 180 via a console 190 which is provided outside the MRI apparatus 100, and to display a produced magnetic resonance image via the console 190. The magnetic field generation unit which is accommodated within the housing 110 includes a main magnet which is used to apply a strong magnetic field to a human body, a gradient coil which is used to apply a gradient magnetic field to provide location information which relates to a magnetic field, and a radio frequency (RF) coil which is used to apply an electromagnetic wave to a human body so that a magnetization vector resonates within the human body and to receive a magnetic resonance signal from the human body. The magnetic field generation unit for performing MRI is well known in the art, and does not limit exemplary embodiments.

The housing 110 is a cylinder, i.e., a substantially cylindrical structure, which includes a bore. A table 120, on which an inspection target lies, is insertable into the bore. The cylinder denotes not only an entirely-cylindrical structure but also a partially-cylindrical structure. Reference numeral 110a indicates an inner wall that at least partially forms the bore of the housing 110. As will be described later, the inner wall 110a of the housing 110 functions as a screen for a beam projector 160.

The table 120 includes a moving table 121 which enables a lying inspection target to be automatically moved into the bore of the housing 110, a support 122 which movably supports the moving table 121, and a table driving unit 125 which drives a movement 126 of the moving table 121 under the control of the MRI control system 180.

The beam projector 160, which projects an image into the bore of the housing 110, a detachable module 150, to and from which the beam projector 160 is attachable and detachable, and the MRI control system 180, which controls the beam projector 160 and the detachable module 150, constitute the in-bore display device.

The detachable module 150 is installed on the moving table 121, and the beam projector 160 is detachably attached to the detachable module 150. A coupling portion of the detachable module 150 that couples to the beam projector 160 may be coupled by using a connector or dock, which is commonly known in the art.

Figure 4:
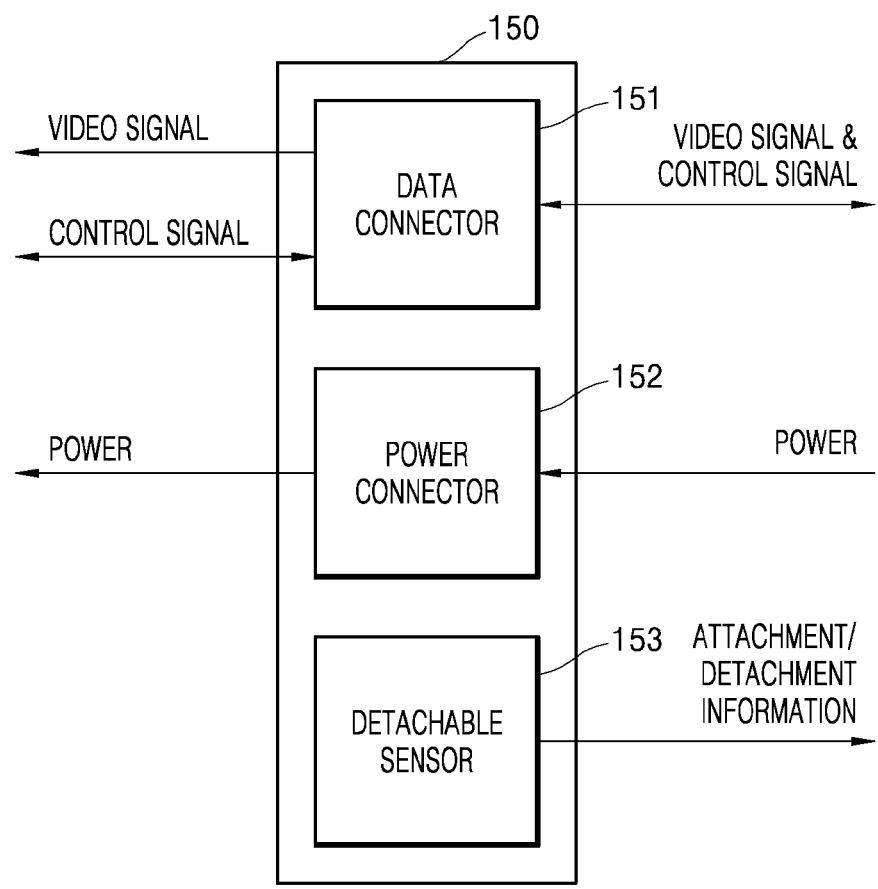
FIG. 4 is a block diagram of a beam projector detachable module of the MRI apparatus of FIG. 1, according to an exemplary embodiment.

The detachable module 150 may be disposed adjacent to the head of an inspection target who is lying on the table 120 in order to be scanned. The location of the head of the inspection target may be varied based on scanning purposes. Thus, the detachable module 150 may include a first detachable submodule 150-1 and a second detachable submodule 150-2 which are respectively disposed on both opposite ends of the moving table 121 with respect to the longitudinal direction, so as to cover the two directions in which the inspection target lies. The first detachable submodule 150-1 and the second detachable submodule 150-2 may have the same components. In the description below, the detachable module 150 may be referred to as either the first detachable submodule 150-1 or the second detachable submodule 150-2. Each of the first detachable submodule 150-1 and the second detachable submodule 150-2 may not only allow the beam projector 160 to be detachably attached thereto, but also may perform a function of a connector that transmits power, a video signal, and a control signal which are supplied from the MRI control system 180, which is installed outside of the housing 110, to the beam projector 160. Moreover, each of the first detachable submodule 150-1 and the second detachable submodule 150-2 may include a detachable sensor 153 as illustrated in FIG. 4, which senses an attachment or a detachment of the beam projector 160, in order to transmit information which relates to an attachment or a detachment of the beam projector 160 to the MRI control system 180. The information which relates to an attachment or a detachment of the beam projector 160 will be hereinafter referred to as attachment/detachment information.

The beam projector 160 projects an image. The beam projector 160 may be attached to (i.e., docked on) one of the first detachable submodule 150-1 and the second detachable submodule 150-2. When the moving table 121 is inserted into the bore of the housing 110 with the beam projector 160 attached to either the first detachable submodule 150-1 or the second detachable submodule 150-2, the beam projector 160 projects a light beam of an image onto the inner wall 110a, which forms the bore. In particular, the inner wall 110a of the housing 110 serves as a screen for the beam projector 160.

Figure 3:
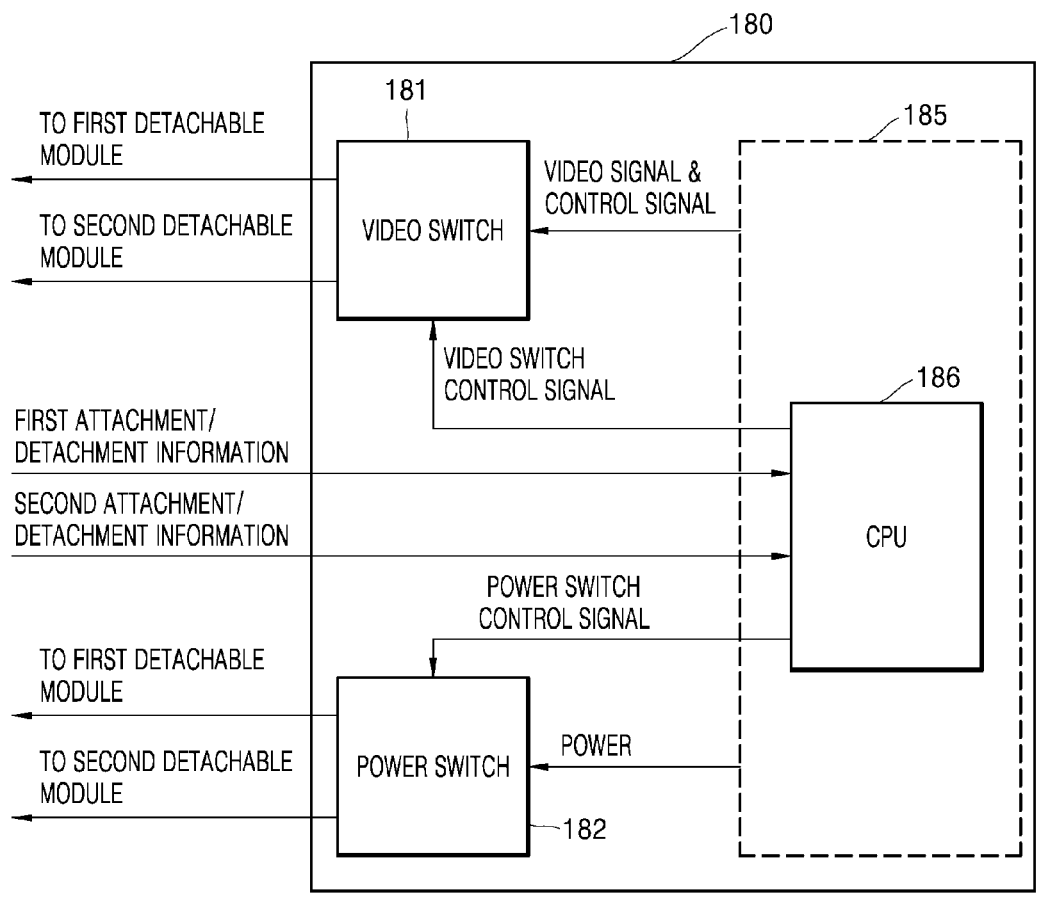
FIG. 3 is a block diagram of an MRI control system of the MRI apparatus of FIG. 1, according to an exemplary embodiment.

FIG. 3 is a block diagram of the MRI control system 180, according to an exemplary embodiment. Referring to FIGS. 2 and 3, the MRI control system 180 includes a signal processor 185 for projection, which processes a control signal for controlling the detachable module 150 and the beam projector 160, which form the in-bore display device, and a video signal that is supplied to the beam projector 160. The signal processor 185 for projection may be a part of a signal processing unit which controls various units of the MRI apparatus 100 and processes magnetic resonance images. The video signal that is processed by the signal processor 185 for projection may include various contents that may ease the tension of an inspection target and provide useful information to the inspection target during an MRI scan. These contents may include content such as any one or more of a moving picture, a picture, scanning state information (e.g., scan time information, scan guide information, and scanned area information), and information for use in performing an MRI.

The MRI control system 180 may further include a video switch 181, which switches a transmission path of the video signal and the control signal to either the first or second detachable submodule 150-1 or 150-2 to which the beam projector 160 is attached, and a power switch 182, which switches a transmission path of projector power to either the first or second detachable submodule 150-1 or 150-2 to which the beam projector 160 is attached. The signal processor 185 includes a central processing unit (CPU) 186, wherein the CPU 186 may generate a video switch control signal and a power switch control signal based on the attachment/detachment information received from the detachable module 150, and may control the operations of the video switch 181 and the power switch 182 based on the generated signals. If the beam projector 160 is attached to the first detachable submodule 150-1, the first detachable submodule 150-1 may transmit first attachment/detachment information to the MRI control system 180. If the beam projector 160 is attached to the second detachable submodule 150-2, the second detachable submodule 150-2 may transmit second attachment/detachment information to the MRI control system 180.

FIG. 4 is a block diagram of the detachable module 150. The detachable module 150 of FIG. 4 may include either or both of the first detachable submodule 150-1 and the second detachable submodule 150-2.

Referring to FIGS. 2 and 4, the detachable module 150 includes a data connector 151 which is configured for transmitting a video signal and a control signal, and a power connector 152. The detachable module 150 may further include the detachable sensor 153. The detachable sensor 153 senses an attachment or a detachment of the beam projector 160 and transmits attachment/detachment information to the MRI control system 180 so that the MRI control system 180 may ascertain to which one of the first and second detachable submodules 150-1 and 150-2 the beam projector 160 has been attached. The data connector 151 or the power connector 152, instead of the detachable sensor 153, may detect a change in a signal that is fed back, and thus may determine to which one of the first and second detachable submodules 150-1 and 150-2 the beam projector 160 has been attached. As described above, the MRI control system 180 may allow the video signal/control signal and power to be supplied to one of the first and second detachable submodules 150-1 and 150-2, based on the attachment/detachment information.

Figure 5:
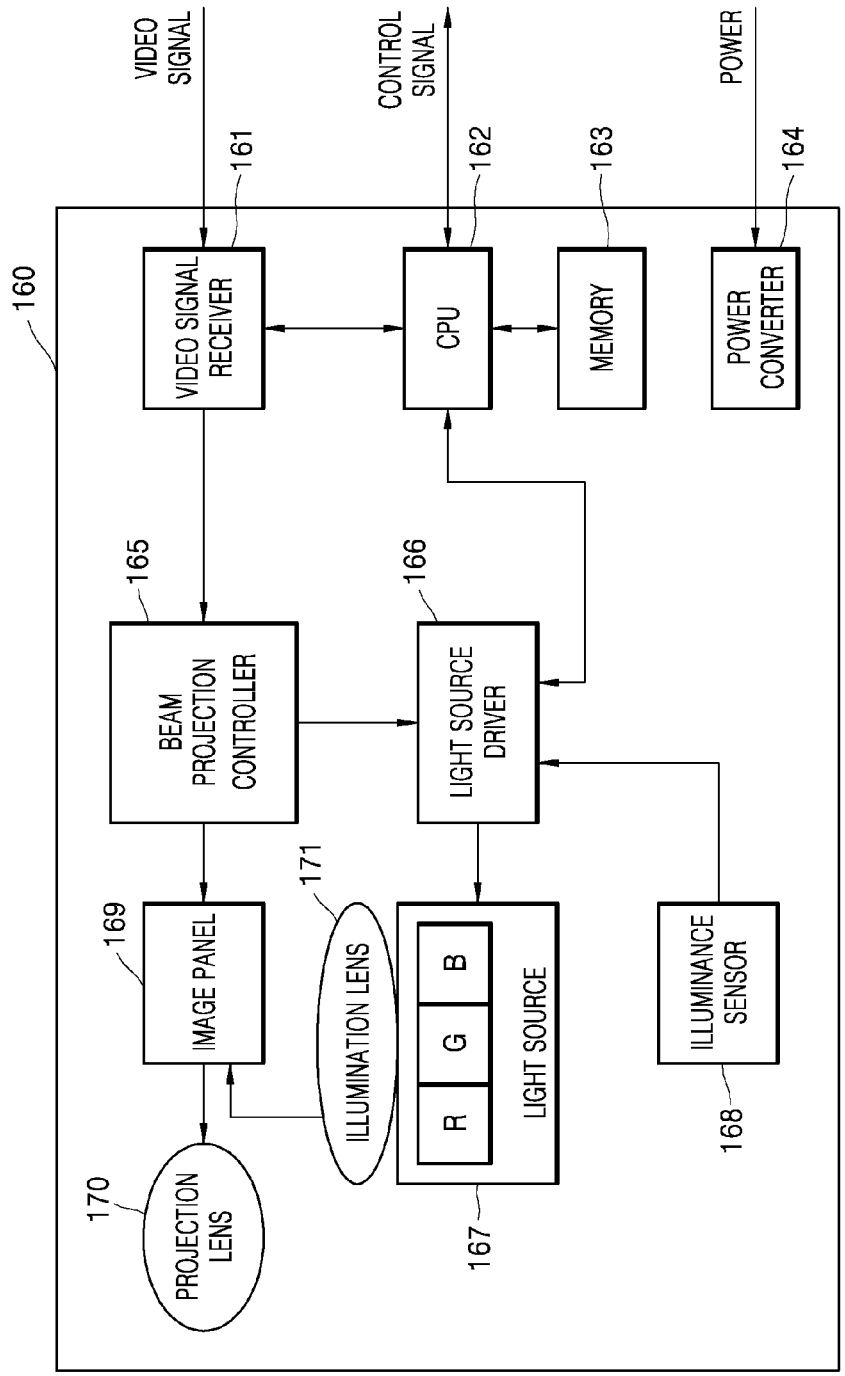
FIG. 5 is a block diagram of a beam projector of the MRI apparatus of FIG. 1, according to an exemplary embodiment.

FIG. 5 is a block diagram of the beam projector 160, according to an exemplary embodiment. Referring to FIGS. 2 and 5, the beam projector 160 includes a video signal receiver 161, a CPU 162, a beam projection controller 165, a light source driver 166, a light source 167, an image panel 169, a projection lens 170, and an illumination lens 171. When receiving video data from the MRI control system 180, the video signal receiver 161 transmits the video signal to the beam projection controller 165. The beam projection controller 165 converts the video signal into a video signal for beam projection and then transmits the video signal for beam projection to the image panel 169. The image panel 169 may include a commonly-known image panel, such as, for example, a transmissive liquid crystal display (LCD) panel or a reflective digital micromirror device (DMD) panel. The beam projection controller 165 also transmits to the light source driver 166 a light source driving signal which corresponds to the video signal for beam projection. The CPU 162 included in the beam projector 160 controls the video signal receiver 161 or the light source driver 166 based on the control signal received from the detachable module 150 and a series of pieces of control data which are stored in a memory 163. The beam projector 160 may further include a power converter 164 which converts power into power segments which have respective sizes which are suitable for various units of the beam projector 160. The image panel 169 forms an image based on the video signal for beam projection. When the light source 167 is driven in accordance with the received light source driving signal, a light beam which is illuminated to the image panel 169 via the illumination lens 171 is modulated based on the image which is formed on the image panel 169 while being transmitted or reflected by the image panel 169, and is projected via the projection lens 170. The projection lens 170 is manually or automatically brought into focus so that a light beam of the projected image forms an image on the inner wall 110a of the housing 110.

The beam projector 160 may further include an illuminance sensor 168 which senses an illuminance of the inside of the bore of the housing 110. In this case, information which relates to the illuminance of the inside of the bore which is sensed by the illuminance sensor 168 may be transmitted to the light source driver 166 so that the light source driver 166 may adjust the brightness of the light source 167 when driving the light source 167. For an example, the brightness of the light source 167 may vary based on the depth of the bore of the housing 110. Accordingly, the brightness of the light source 167 may be controlled based on a depth to which the moving table 121 enters the housing 110. In particular, as the position of an image formed on the inner wall 110a of the housing 110 changes, the amount of light of an image projected by the beam projector 160 varies, so that the brightness of the projected image may be maintained at a constant level.

Because heat is generated by the light source 167 and the like while the beam projector 160 is being driven, the heat generated in the beam projector 160 may sensitively affect the inspection target. Accordingly, the beam projector 160 is disposed to be separated from the head of the inspection target by a predetermined distance. The beam projector 160 may further include a heat dissipation member (not shown). Commonly known structures, such as a heat sink and a heat dissipation fan, may be used as the heat dissipation member. When an electromagnetic motor for driving a heat dissipation fan is used, an electromagnetic shield may be needed when applying a high magnetic field within the bore of the housing 110.

Because images for projection have various resolutions and various sizes, the beam projection controller 165 may include a scaler for performing scaling signal processing in order to scale the received video signal in accordance with a beam projection format (for example, any one or more of a resolution, an image size, and the like). When the console 190 of FIG. 1 selects a to-be-projected image based on a manipulation by a user, the to-be-projected image data may be transmitted to the beam projector 160 via the MRI control system 180, and the scaler in the beam projection controller 165 may scale the to-be-projected image data in accordance with a beam projection format. As another example, the scaler may be installed in the MRI control system 180 instead of the beam projection controller 165.

Because the beam projector 160, together with the moving table 121, is inserted into the bore of the housing 110, the beam projector 160 may include an electromagnetic field shield so as to avoid being affected by or affecting a magnetic field and an electric field within the bore of the housing 110.

The beam projector 160 may also form a circuit which is configured for minimizing the influence of a high magnetic field within the bore of the housing 110.

Figure 6:
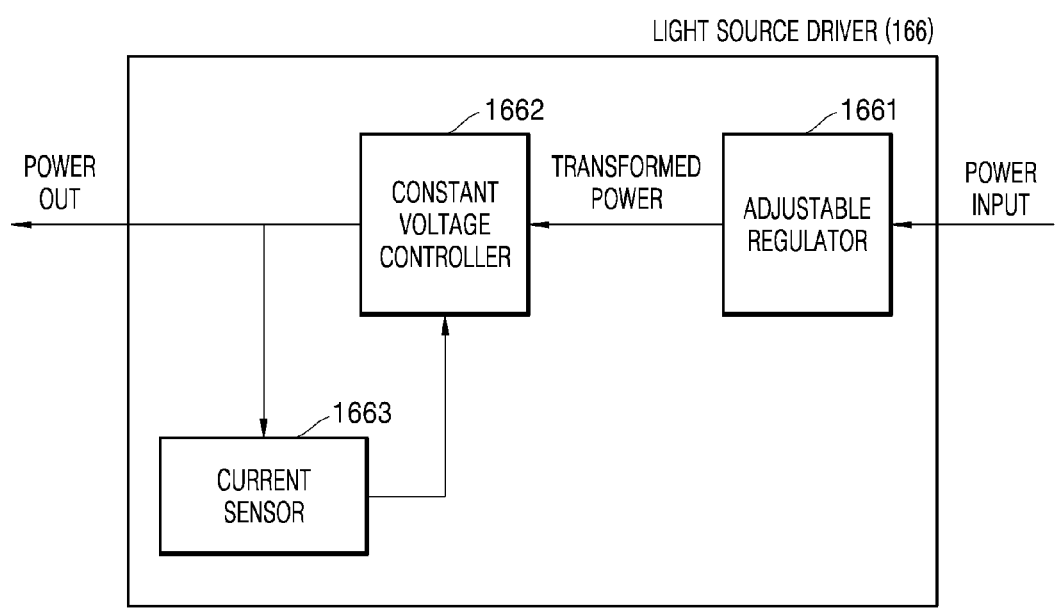
FIG. 6 is a block diagram of a constant voltage control circuit of a light source driver of the beam projector of FIG. 5.

FIG. 6 is a block diagram of a schematic structure of a constant voltage control circuit of the light source driver 166, which is a part of the circuit block of the beam projector 160. Referring to FIG. 6, the light source driver 166 is required to supply constant voltage power to the light source 167, even when a rapidly-changing current is generated, in order to make the brightness of the light source 167 constant during an operation of the beam projector 160. The light source driver 166 may use an adjustable regulator 1661 that uses no inductors in order to minimize the influence of a high magnetic field. The adjustable regulator 1661 transforms input power into a pre-set constant voltage and outputs the pre-set constant voltage. Because the adjustable regulator 1661 uses no inductors, the adjustable regulator 1661 is not greatly affected by a strong magnetic field within the bore of the housing 110. However, when only the adjustable regulator 1661 is used, a switching time may be delayed because of its characteristics. Thus, when a current changes rapidly, there may be a difficulty with respect to maintaining a stable output of a constant voltage power level. Accordingly, the light source driver 166 may further include a constant voltage controller 1662 and a current sensor 1663. The constant voltage controller 1662 may include a fast switching device, such as, for example, a field effect transistor (FET) or a transistor (TR). The current sensor 1663 senses a current supplied to the light source 167 and feeds information which relates to a magnitude of the current back to the constant voltage controller 1662. The constant voltage controller 1662 stably supplies the constant voltage power to the light source 167 under the fast control of the fast switching device, based on the information which relates to the current magnitude sensed by the current sensor 1663, so that the light source 167 emits a light beam with a constant brightness for use in beam projection.

Figure 7:
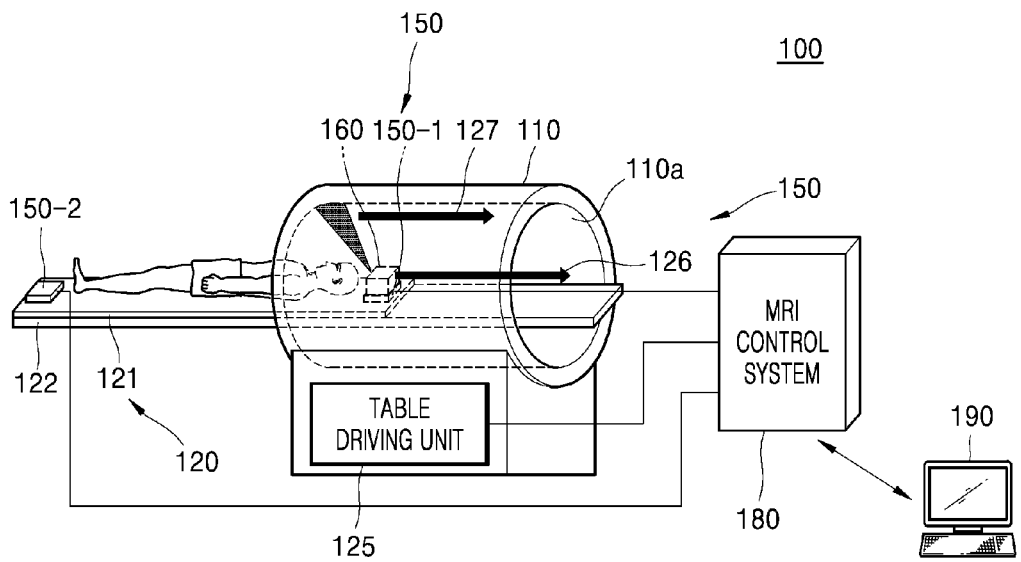
FIGS. 7, 8, and 9 illustrate an operation of the MRI apparatus of FIG. 1.
Figure 8:
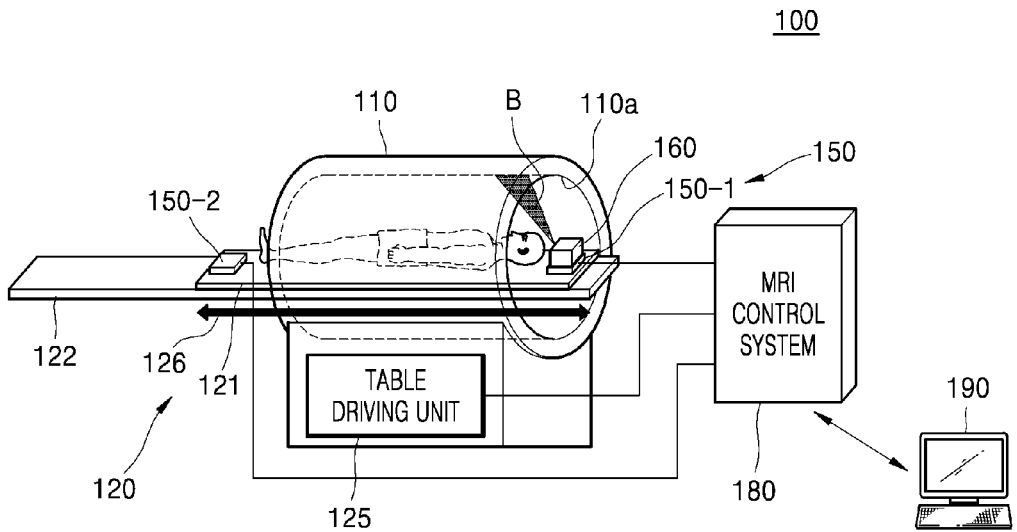
Figure 9:
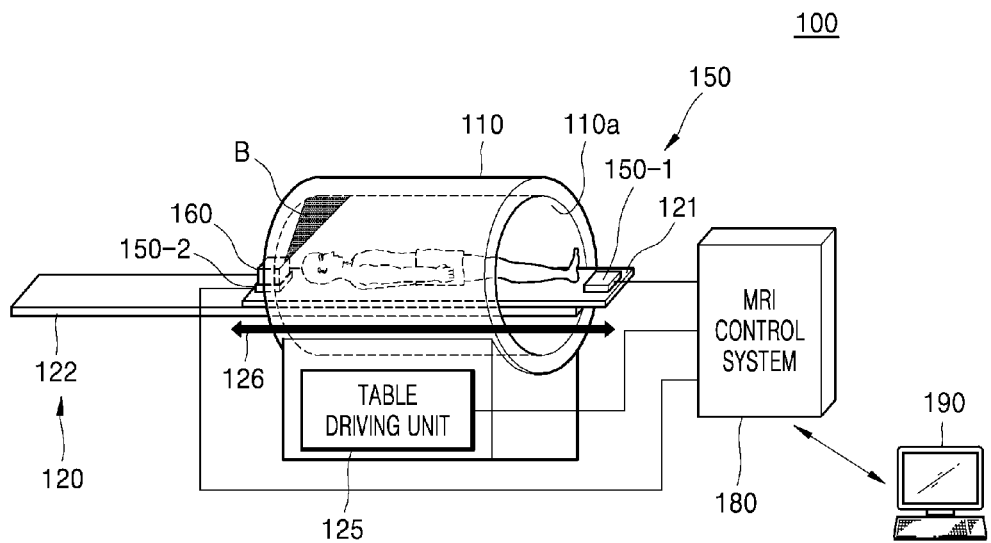

FIGS. 7, 8, and 9 illustrate an operation of the MRI apparatus 100.

FIGS. 7 and 8 illustrate a movement 126 of the housing 110 when an inspection target lies on the moving table 121. Referring to FIGS. 7 and 8, an MRI scan is conducted when the inspection target lies on the moving table 121. Accordingly, before the MRI scan starts, the beam projector 160 is mounted on one of the first and second detachable submodules 150-1 and 150-2 that is adjacent to the head of the inspection target. FIGS. 7 and 8 illustrate a case in which the first detachable submodule 150-1 is adjacent to the head of the inspection target.

When an MRI scan starts, the moving table 121 enters the bore of the housing 110. When the moving table 121 enters the bore of the housing 110, the beam projector 160 is driven to project an image onto the inner wall 110a of the housing 110. The beam projector 160 may start image projection at the moment when the head of the inspection target enters the bore of the housing 110, immediately before the head of the inspection target enters the bore of the housing 110, or immediately after the head of the inspection target enters the bore of the housing 110. Alternatively, the point of time when the beam projector 160 starts image projection may be set to be a point of time when the moving table 121 enters the bore of the housing 110, regardless of the location of the head of the inspection target.

The beam projector 160 projects an image to a part of the inner wall 110a of the housing 110 that is visible via the eyes of the inspection target. When the inspection target is requested to face upward and not move during an MRI scan, the beam projector 160 may project an image to a part of the inner wall 110a of the housing 110 that is located above the head of the inspection target.

As the beam projector 160 is disposed adjacent to the head of the inspection target, the beam projector 160 may project an image such that the viewing angle of the inspection target is ensured. In addition, as the beam projector 160 is mounted on the moving table 121, the image projected by the beam projector 160 may make a movement 127 which corresponds with the movement 126 of the moving table 121. As a result, because an image moves together with a movement of the moving table 121 during an MRI scan, the inspection target may be able to see the image without needing to move his or her eyes.

The image that is projected may include content, such as, for example, any one or more of a moving picture, a picture, scanning state information (e.g., scan time information, scan guide information, and scanned area information), and information for use in MRI. For example, when an MRI scan starts, brief scan guide information may be displayed. A scan conclusion time may also be displayed in real time. To ease the tension of the inspection target, an image which is not relevant to the MRI scan, such as news, may also be displayed.

The direction in which the head of the inspection target is oriented may be changed with respect to the lengthwise direction of the moving table 121, based on scan purposes.

Referring to FIG. 9, the direction of the head of the inspection target is opposite to that illustrated in FIGS. 7 and 8. When the position of the inspection target is changed as in FIG. 9, the beam projector 160 is detached from the first detachable submodule 150-1 and is newly attached to the second detachable submodule 150-2 adjacent to the head of the lying inspection target whose position has been changed. In particular, in FIGS. 7 and 8, because the head of the inspection target is adjacent to the first detachable submodule 150-1, the beam projector 160 operates while attached to the first detachable submodule 150-1. However, in FIG. 9, because the head of the inspection target is changed to be adjacent to the second detachable submodule 150-2, the beam projector 160 is detached from the first detachable submodule 150-1 and attached to the second detachable submodule 150-2. As described above, because each of the first and second detachable submodules 150-1 and 150-2 includes the detachable sensor 153 of FIG. 4, such detachment or attachment may be detected. When the information which relates to a detachment or an attachment of the beam projector 160 is transmitted to the MRI control system 180, the MRI control system 180 interrupts the supply of the video signal/control signal and power to the first detachable submodule 150-1 from which the beam projector 160 is detached, and starts supply of the video signal/control signal and power to the second detachable submodule 150-2 to which the beam projector 160 is attached.

The point of time when the beam projector 160 starts image projection may vary based on whether a first arrangement (i.e., the case of FIGS. 7 and 8), in which the head of the inspection target is oriented towards the bore of the housing 110, or a second arrangement (i.e., the case of FIG. 9), in which the legs of the inspection target are oriented towards the bore of the housing 110, is used. In particular, when the first arrangement is used, image projection onto the inner wall 110a of the housing 110 may start at the moment when the head of the inspection target enters the bore of the housing 110. When the second arrangement is used, image projection onto the inner wall 110a of the housing 110 may start at the moment when the neck of the inspection target enters the bore of the housing 110. Of course, the point of time when the beam projector 160 starts image projection may vary based on a user's selections.

When a user selects suitable content via the console 190, information which relates to the selected content is transmitted to the beam projector 160 via the MRI control system 180 and the detachable module 150, and the CPU 162 of the beam projector 160 controls each unit of the beam projector 160 to project an image, in response to an image output request. When the selected content does not conform to a resolution and an image size which is suitable for image output, the MRI control system 180 may transmit, to the beam projector 160, a control command that requests an image output to be changed, and the beam projection controller 165 of the beam projector 160 may scale the selected content up or down, in accordance with the suitable resolution and the suitable image size, in response to the request for an image output change.

Conventional MRI apparatuses may cause, for example, the boredom of an inspection target due to a long scan, an inconvenience of the inspection target due to the narrowness of a space where the inspection target lies, and the degradation in the quality of an MRI image due to a movement of the inspection target during a scan by such boredom or inconvenience. Conversely, the MRI apparatus 100 according to the present exemplary embodiment is capable of providing various types of content to an inspection target by displaying an image within an open space of the bore according to a beam projection method as described above, thereby reducing the boredom or inconvenience of the inspection target due to a long scan. This leads to a reduction in the movement of the inspection target, thus preventing degradation in the quality of an MRI image.

Figure 10:
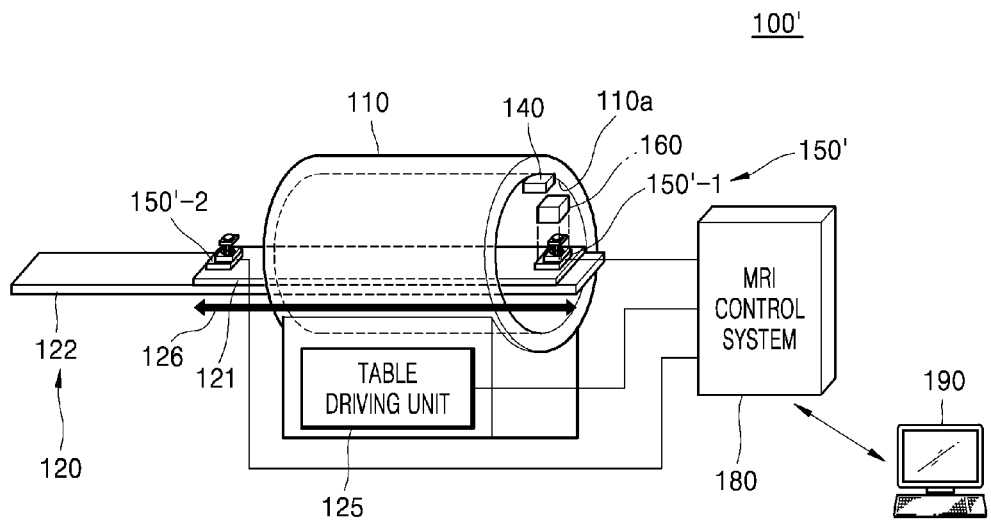
FIG. 10 is a schematic diagram of an MRI apparatus, according to another exemplary embodiment.
Figure 11:
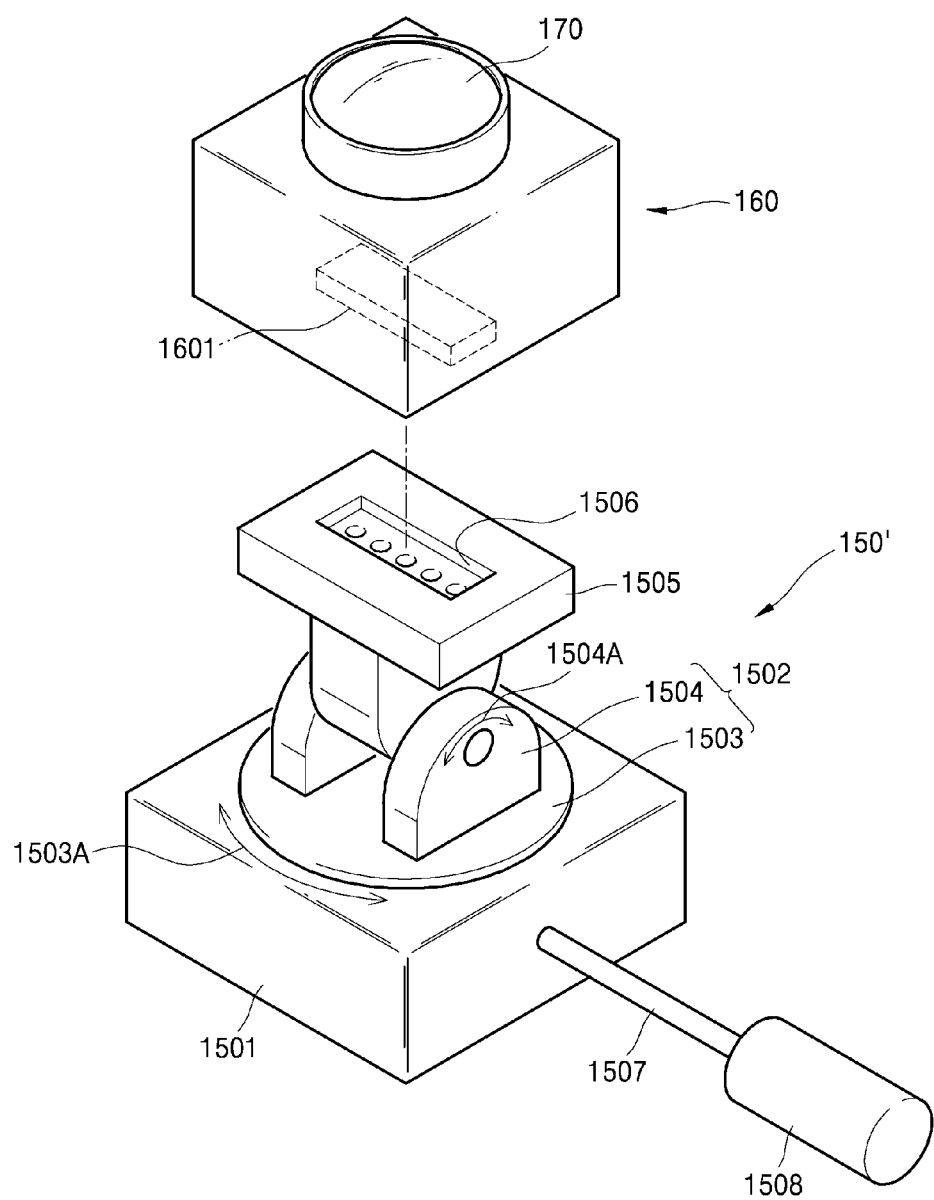
FIG. 11 is a schematic perspective view of a detachable module employed in the MRI apparatus of FIG. 10.
Figure 12:
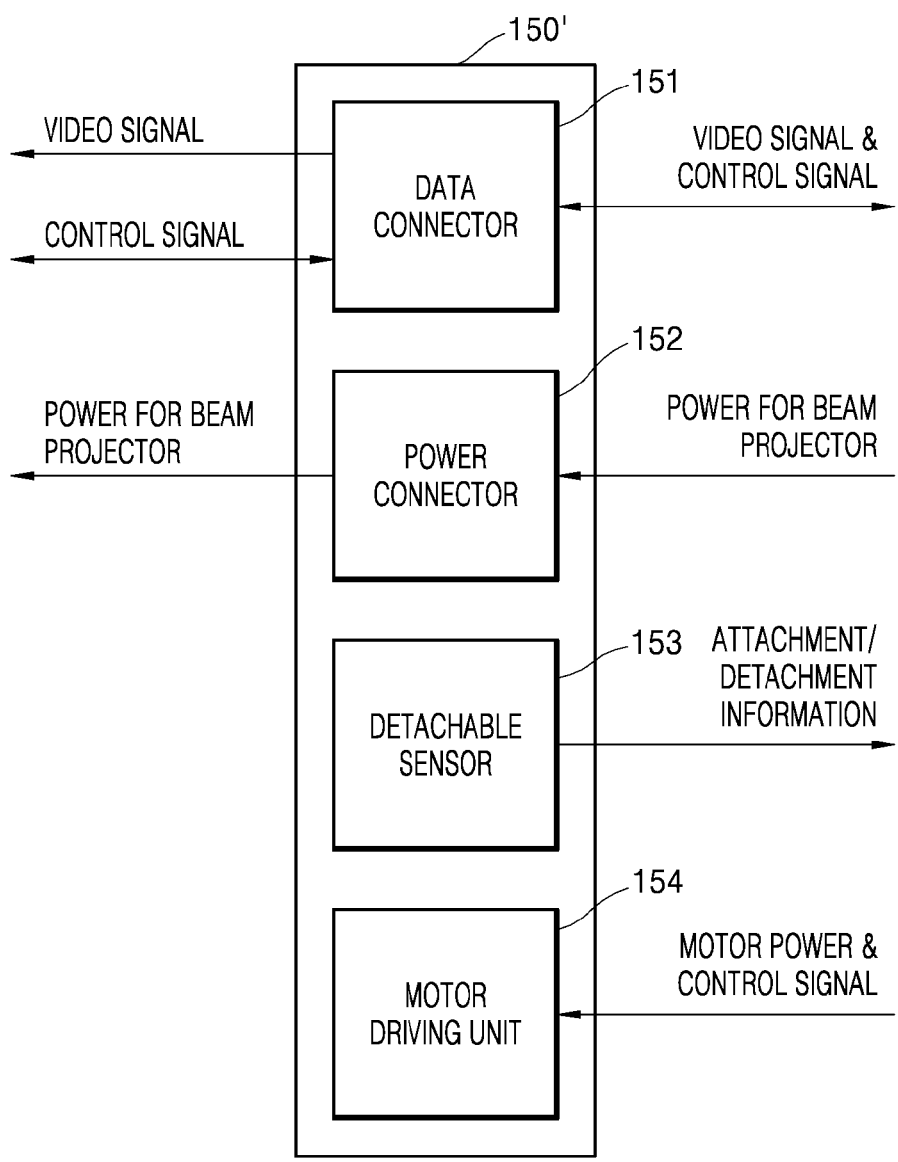
FIG. 12 is a block diagram of the detachable module of FIG. 11.

FIG. 10 is a schematic diagram of an MRI apparatus 100', according to another exemplary embodiment, FIG. 11 is a schematic perspective view of a detachable module 150' which is employed in the MRI apparatus 100' of FIG. 10, and FIG. 12 is a block diagram of the detachable module 150' of FIG. 11. The MRI apparatus 100' according to the present exemplary embodiment is substantially the same as the MRI apparatus 100 according to the previous exemplary embodiment except for the detachable module 150', so a duplicate description thereof will be omitted.

Referring to FIGS. 10, 11, and 12, the detachable module 150' according to the present exemplary embodiment may include a first detachable submodule 150'-1 and a second detachable submodule 150'-2 which are respectively disposed on both opposite ends of the moving table 121 with respect to the longitudinal direction, as in the previous exemplary embodiment. The first detachable submodule 150'-1 and the second detachable submodule 150'-2 may have the same components. In the described below, the detachable module 150' may be referred to as either the first etachable submodule 150'-1 or the second detachable submodule 150'-2.

The detachable module 150' includes a base member 1501 which is fixed onto the moving table 121, and a rotating unit 1502 which is mounted on the base member 1501. The rotating unit 1502 may include, for example, a first rotating subunit 1503, which rotates in a first direction 1503A, and a second rotating subunit 1504, which rotates in a second direction 1504A. The first direction 1503A and the second direction 1504A may be different from each other, and thus a holder 1505 may be directed in any direction by a combination of the first direction 1503A and the second direction 1504A. For example, the first direction 1503A of the first rotating subunit 1503 may be a direction in which the first rotating subunit 1503 rotates about a rotation axis that is in a normal direction of the base member 1501, and the second direction 1504A of the second rotating subunit 1504 may be a direction in which the second rotating subunit 1504 rotates about a rotation axis that is perpendicular to the rotation axis of the first direction 1503A.

The detachable module 150' may further include a driving motor 1508 which rotates the rotating unit 1502. The driving motor 1508 is controlled by the MRI control system 180. A driving shaft 1507 delivers a driving force between the rotating unit 1502 and the driving motor 1508, and may be rigid or flexible. When the rotating unit 1502 includes the first and second rotating subunits 1503 and 1504, the driving force delivered by the driving shaft 1507 may selectively distributed to one of the first and second rotating subunits 1503 and 1504. The driving motor 1508 may be disposed outside the housing 110 such as not to enter the bore of the housing 110, and may still transmit the driving force to the rotating unit 1502 via the driving shaft 1507. If the driving motor 1508 is located outside the housing 110, even when an electromagnetic motor is used as the driving motor 1508, an influence of a magnetic field within the bore of the housing 110 upon the driving motor 1508 may be effectively reduced, and thus the burden of having to include an electromagnetic shield may be reduced.

The holder 1505 is mounted on the rotating unit 1502, and the beam projector 160 is mounted on the holder 1505 such as to be detachable therefrom. The holder 1505 includes a connector 1506, which comes in electrical and mechanical contact with a connector 1601 of the beam projector 160. The connector 1506 of the holder 1505 includes electrode terminals which are configured for transmitting the video signal and the control signal received from the MRI control system 180 to the beam projector 160. The video signal, the control signal, and the power may be transmitted from the detachable module 150' to the beam projector 160, via mutual connection between the connector 1506 of the detachable module 150' and the connector 1601 of the beam projector 160.

Rotation of the rotating unit 1502 changes the direction of the holder 1505, on which the beam projector 160 is held. Thus, the direction in which the beam projector 160 projects an image may be changed to correspond to the direction that the inspection target faces.

Referring to FIG. 12, the detachable module 150' may further include a motor driving unit 154 which is configured for driving the driving motor 1506, in contrast with the detachable module 150 of FIG. 4. The motor driving unit 154 receives motor power and a control signal for driving the driving motor 1506 from the MRI control system 180 and thus drives the driving motor 1506, thereby changing the direction in which the beam projector 160 projects an image.

Figure 13:
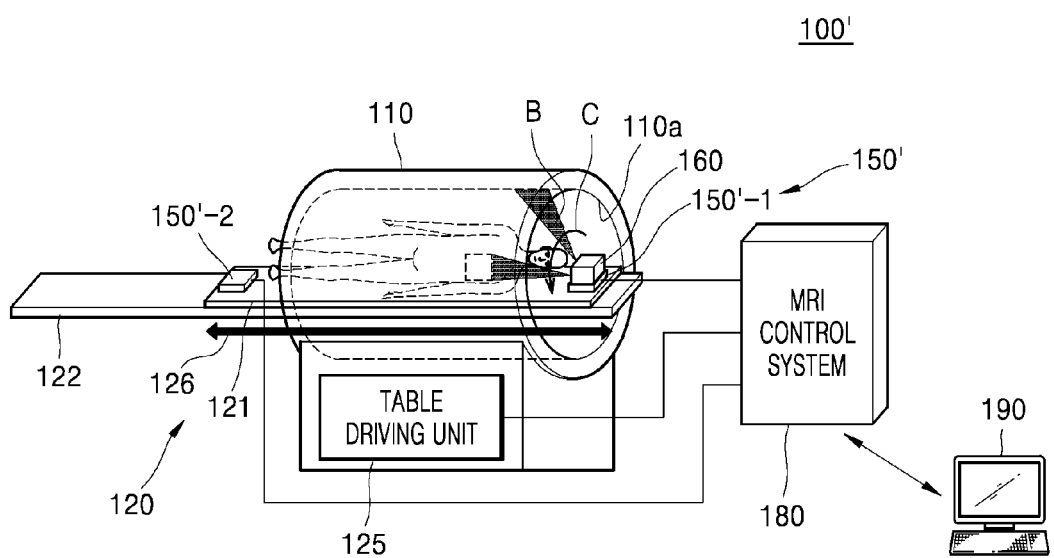
FIG. 13 illustrates an operation of the MRI apparatus of FIG. 10.

FIG. 13 illustrates an operation of the MRI apparatus 100' of FIG. 10.

The direction in which the inspection target lies on the moving table 121 may be changed based on scan purposes. For example, as illustrated in FIG. 13, the inspection target may turn to lie on his or her side for a specific purpose of MRI scanning. In this case, because the inspection target faces a side direction, the detachable module 150' (i.e., the first detachable submodule 150'-1 or the second detachable submodule 150'-2) to which the beam projector 160 has been attached may rotate the rotating unit 1502 as indicated by reference character C, so that the beam projector 160 may project an image in the side direction, which is the same as the direction that the inspection target faces.

Such a change in the direction in which the beam projector 160 projects an image may be automatically performed, or may be performed by a manipulation of a user. When the inspection target turns to lie on his or her side, a user may manipulate the console 190 in correspondence with the movement of the inspection target so that the beam projector 160 may project an image in the side direction.

Referring back to FIG. 10, the MRI apparatus 100' may further include a location tracking sensor 140 in order to sense the location where the inspection target lies or the direction that the inspection target faces. The location tracking sensor 140 may include a camera which is configured for photographing the face of an inspection target, or any other common sensor. For example, when the location tracking sensor 140 includes a camera, a picture taken from the face of the inspection target is sent to the MRI control system 180, and the signal processor 185 for projection of the MRI control system 180 detects the position of the eyeball of the inspection target from the picture of the face of the inspection target. A method for detecting the position of the eyeball of the inspection target from the picture of the face of the inspection target is a commonly known technology, so a detailed description thereof will be omitted. The MRI control system 180 may automatically control the rotating unit 1502 of the detachable module 150' to be rotated in correspondence with the detected position of the eyeball of the inspection target, as indicated by reference character C in FIG. 13, so that the beam projector 160 may project an image in the same direction as the direction that the inspection target faces.

In the exemplary embodiment of FIGS. 10, 11, 12, and 13, the rotating unit 1502 which is included in the detachable module 150' is an example of a projection direction converter that converts the direction in which the beam projector 160 projects an image. As another example, the beam projector 160 may include such a projection direction converter. For example, the projection lens 170 may be mounted in the housing of the beam projector 160 such that the direction of the projection lens 170 is changeable.

Although a driving module which includes the driving shaft 1507 and the driving motor 1508 is illustrated in the exemplary embodiment of FIGS. 10, 11, 12, and 13, other well-known driving mechanisms may be employed. For example, a hydraulic system may be used as the driving module of the rotating unit 1502 of the detachable module 150'. The rotating unit 1502 may be manually rotated.

Although it is illustrated in the exemplary embodiment of FIGS. 10, 11, 12, and 13 that the direction of the holder 1505 is changed due to a combination of horizontal rotation and vertical rotation of the first and second rotating subunits 1503 and 1504 of the detachable module 150', a mono-axis rotation mechanism or a multi-axis rotation mechanism may be employed as the rotating unit of the detachable module 150'. Alternatively, the beam projector 160 may be coupled to or docked on a plurality of locations on the detachable module 150' that include an upper surface and left and right side surfaces of the detachable module 150', and thus the direction in which the beam projector 160 projects an image may be changed by suitably selecting locations on the detachable module 150' to which the beam projector 160 is to be coupled from among the plurality of locations.

Figure 14:
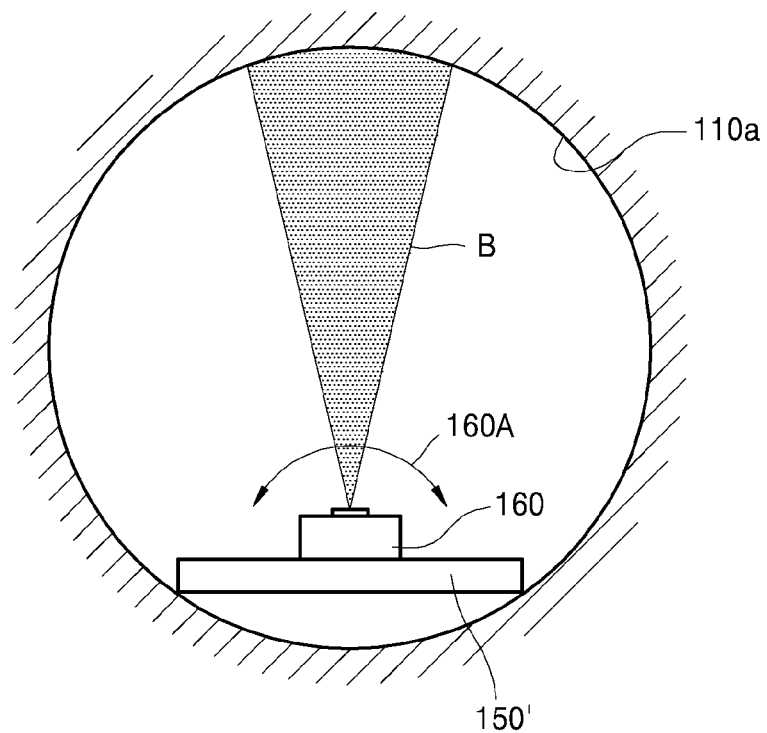
FIG. 14 is a diagram which illustrates a curved surface distortion of a projected image in the MRI apparatus of FIG. 10.
Figure 15:
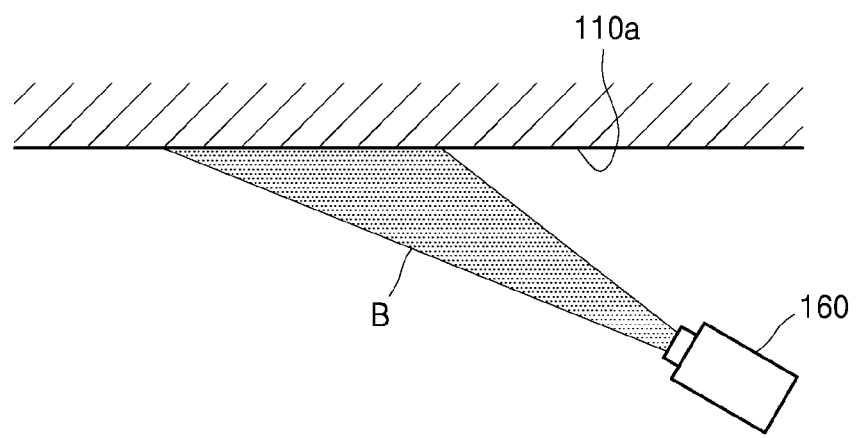
FIG. 15 is a diagram which illustrates a skew distortion of a projected image in the MRI apparatus of FIG. 10.

FIG. 14 is a diagram which illustrates a curved surface distortion of a projected image in the MRI apparatus 100' of FIG. 10, and FIG. 15 is a diagram which illustrates a skew distortion of a projected image in the MRI apparatus 100' of FIG. 10.

The inner wall 110a of the housing 110 has a cylindrical cross-section. Thus, an image projected on the inner wall 110a of the housing 110 exhibits a curved surface distortion due to the curve of the inner wall 110a. Accordingly, the beam projection control unit 165 of FIG. 5 may remove a curved surface distortion of an image formed on the inner wall 110a, by generating beforehand a preceding primary distortion for offsetting the curved surface distortion, during video signal processing.

When converting the video signal received from the MRI control system 180 into a video signal for beam projection, the beam projection controller 165 of FIG. 5 may serve as a correction processor that performs a preemptive correction for offsetting a distortion that is generated when an image is projected onto the inner wall 110a of the housing 110.

Referring to FIG. 15, when viewed from the cross-section of the housing 110, a light beam B may be projected, from one side, aslant with respect to the inner wall 110a of the housing 110. If an inspection target faces an upper side of the inner wall 110a of the housing 110 and the beam projector 160 is separated from the head of the inspection target by a predetermined distance, the beam projector 160 may be requested to project the light beam B aslant with respect to the inner wall 110a of the housing 110. Such aslant projection may cause a skew distortion to occur. Accordingly, the beam projection controller 165 may serve as a correction processor that also removes distortion of an image formed on the curved inner wall 110a by additionally generating, during video signal processing, a preceding secondary distortion for offsetting the skew distortion.

When the direction in which the beam projector 160 projects an image makes a movement C along the inner wall 110a of the housing 110 as the direction that the inspection target faces is changed, an image projected onto the inner wall 110a of the housing 110 has a curved surface distortion due to the curved shape of the inner wall 110a. When the direction in which the beam projector 160 projects an image is moved with respect to the vertical direction of the housing 160, the amount of skew distortion may be changed. As such, when the direction in which the beam projector 160 projects an image is changed, the beam projection controller 165 may change the amounts of preceding primary distortion and preceding secondary distortion based on the change.

Although a curved surface distortion due to the curved shape of the inner wall 110a or a skew distortion due to aslant projection onto the inner wall 110a is corrected by execution of a signal processing method in the beam projection controller 165 of FIG. 5 in the present exemplary embodiment, the present inventive concept is not limited thereto. A correction processor that removes either or both of a curved surface distortion and a skew distortion may be included in the MRI control system 180. An optical method, instead of the signal processing method, may be used to remove one or both of these distortions.

Although each of the detachable modules 150 and 150' includes both the first detachable submodule 150-1 and the second detachable submodule 150-2 in the above-described exemplary embodiments, the present inventive concept is not limited thereto. For example, each of the detachable modules 150 and 150' may include only one of the first and second detachable submodules 150-1 and 150-2. Alternatively, each of the detachable modules 150 and 150' may be mounted on three or more locations on the moving table 121. The beam projector 160 may be fixed onto the moving table 121, without interposing the detachable module 150 or 150' therebetween.

Although the bore of the housing 110 has a cylindrical structure in the above-described exemplary embodiments, the present inventive concept is not limited thereto. For example, the bore of the housing 110 may have an oval shape or any of other shapes.

Figure 16:
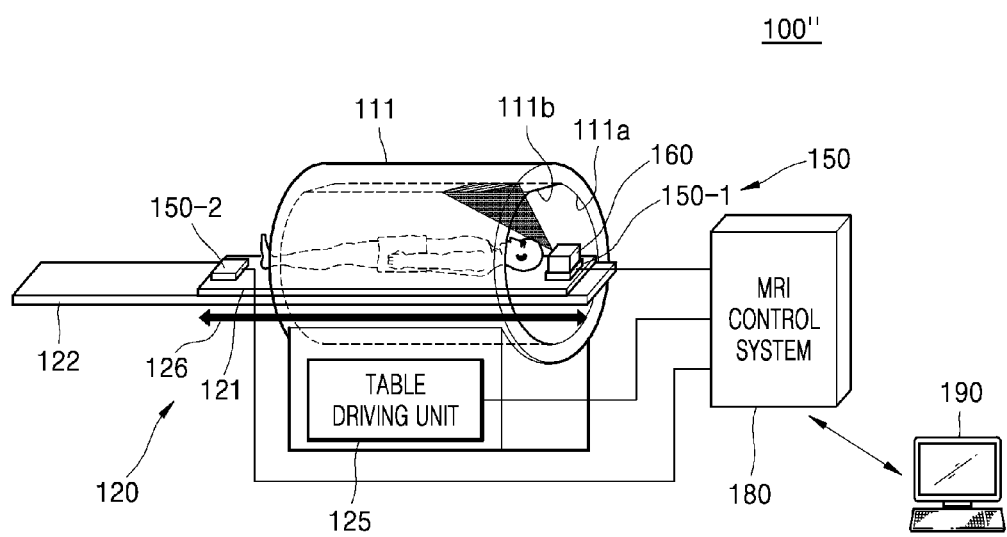
FIG. 16 is a schematic diagram of an MRI apparatus, according to another exemplary embodiment.

FIG. 16 is a schematic diagram of an MRI apparatus 100", according to another exemplary embodiment. Referring to FIG. 16, the bore of a housing 110 of the MRI apparatus 100" may include a curved inner wall 111a and a flat inner wall 111b. The flat inner wall 111b may be formed on an upper part of the bore of the housing 111. The flat inner wall 111b may extend in the lengthwise direction of the bore of the housing 111.

The beam projector 160 may project an image onto the flat inner wall 111b. Since the flat inner wall 111b is positioned on the upper part of the bore that the inspection target faces up when lying on his or her back on the moving table 121, an image projected onto the flat inner wall 111b by the beam projector 160 may be viewed directly by the inspection target while lying on his or her back on the moving table 121. When an image is projected onto the flat inner wall 111b, no curved surface distortion is generated in the projected image, in contrast with the previously described exemplary embodiments. Thus, correction of curved surface distortion may not be performed.

Although the flat inner wall 111b is formed on the upper part of the bore of the housing 111 in the present exemplary embodiment, the present inventive concept is not limited thereto. For example, the flat inner wall 111b may be positioned on a lateral part of the bore of the housing 111.

Although the single flat inner wall 111b is included in the bore of the housing 111 in the present exemplary embodiment, the present inventive concept is not limited thereto. In particular, the bore of the housing 111 may include a plurality of flat inner walls and a plurality of curved inner walls, or may include only a plurality of flat inner walls. For example, the bore of the housing 111 may include only flat inner walls and thus have a polygonal cross-section.

Figure 17:
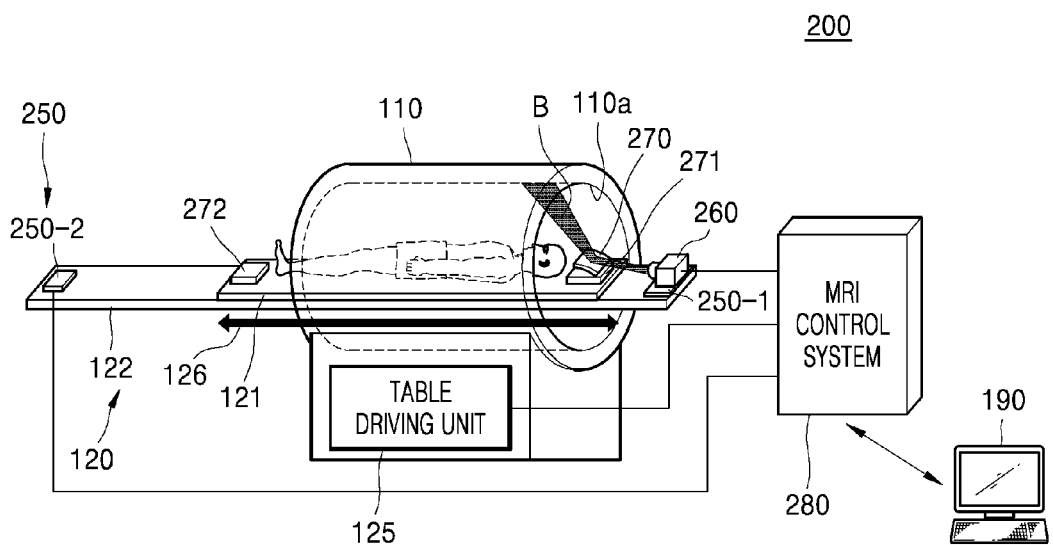
FIG. 17 is a schematic diagram of an MRI apparatus, according to another exemplary embodiment.

FIG. 17 is a schematic diagram of an MRI apparatus 200, according to another exemplary embodiment.

Referring to FIG. 17, in the MRI apparatus 200, only a reflection mirror 270 is installed on the moving table 121, which is movable into the bore of the housing 110, and a beam projector 260 is located outside the bore of the housing 110. At least a part of the support 122 extends outside the bore of the housing 110. The beam projector 260 may be mounted on the part of the support 122 that extends outside the bore of the housing 110. During an MRI scan, because the moving table 121 is supported by the support 122 and enters the bore of the housing 110, and the support 122 is fixed, the reflection mirror 270 on the moving table 121 enters the bore of the housing 110, whereas the beam projector 260 remains outside the bore of the housing 110.

The present exemplary embodiment is substantially the same as the previous exemplary embodiment, except for changes that are generated by positioning the beam projector 260 outside the bore of the housing 110 in accordance with the arrangement of the reflection mirror 270 on the moving table 121.

The beam projector 260 may project a collimated light beam which has an infinite focus. Alternatively, the beam projector 260 may project a convergent light beam or a divergent light beam. The reflection mirror 270 may include an aspherical reflective surface that reflects a light beam projected by the beam projector 260 and that simultaneously magnifies the light beam to a wide angle. Alternatively, the reflection mirror 270 may include a flat panel-type reflective surface that reflects the light beam projected by the beam projector 260 without change.

Similarly as described above with respect to the previous exemplary embodiment, because the location of the head of a lying inspection target may be changed, first and second reflection mirror detachable devices 271 and 272, to and from which the reflection mirror 270 is attachable and detachable, may be respectively installed on both opposite ends of the moving table 121 where the head of the inspection target are to be placed. Each of the first and second reflection mirror detachable devices 271 and 272 may include a rotatable structure that is manually or automatically rotatable in any direction in a similar way to the rotating way of the rotating unit 1502 of the detachable module 150' of FIG. 11. Accordingly, each of the first and second reflection mirror detachable devices 271 and 272 may manually or automatically control the angle of inclination such that the direction in which the reflection mirror 270 reflects an image is consistent with the direction that the inspection target faces.

First and second detachable submodules 250-1 and 250-2, to and from which the beam projector 260 is attachable and detachable, may be respective installed on both opposite ends of the support 122. The beam projector 260, which projects an image from the outside of the bore of the housing 110, the first and second detachable submodules 250-1 and 250-2, to and from which the beam projector 260 is attachable and detachable, the reflection mirror 270, which reflects a light beam projected by the beam projector 260 to the inner wall 110a of the housing 110, the first and second reflection mirror detachable devices 271 and 272, and an MRI control system 280, which controls the beam projector 260 and the projector detachable module 250, constitute an in-bore display device.

Similarly as described above with respect to the previous exemplary embodiment, the first detachable submodule 250-1 and the second detachable submodule 250-2 may not only have the beam projector 260 attach thereto and the beam projector 260 detach therefrom, but also may perform a function of a connector via which power, a video signal, and a control signal which is supplied from the MRI control system 280 are transmitted to the beam projector 260. Moreover, the first detachable submodule 250-1 and the second detachable submodule 250-2 may each include the detachable sensor 153 of FIG. 4 in order to sense an attachment or a detachment of the beam projector 260, and thus may transmit information which relates to the attachment or detachment of the beam projector 260 to the MRI control system 280.

Because the beam projector 260 is disposed outside the bore of the housing 110, in contrast with the previous exemplary embodiment, the beam projector 260 is relatively free from the influence of a magnetic field and an electric field within the bore of the housing 110, and thus it does not need to have a strict electromagnetic field shield. Therefore, the beam projector 260 may be designed more freely. In the above-described exemplary embodiment, when the beam projector 160 is situated within the bore of the housing 110, a circuit of the light source driver 166, in preparation for a high magnetic field, is separately designed as described above with reference to FIG. 6. However, in the present exemplary embodiment, the burden of designing such a circuit is reduced.

Figure 18:
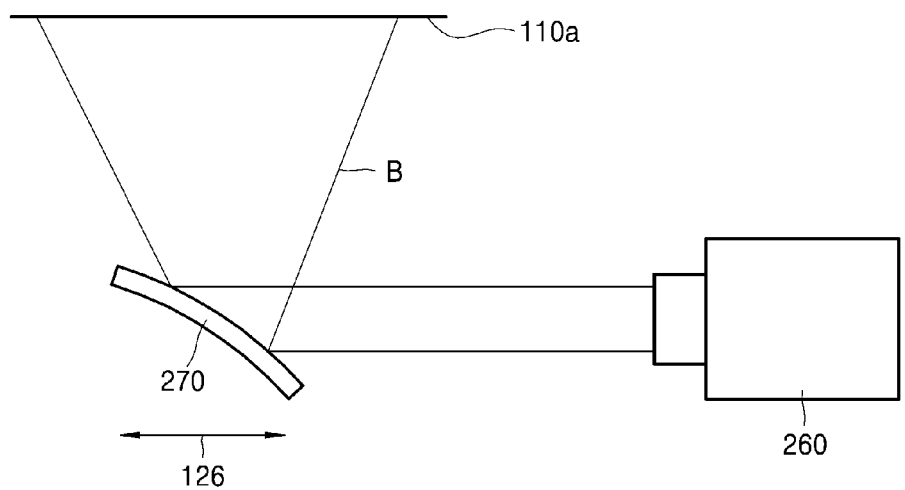
FIG. 18 illustrates an in-bore displaying operation of the MRI apparatus of FIG. 17.

FIG. 18 illustrates a displaying operation within the bore of the MRI apparatus 200 of FIG. 17. Referring to FIG. 18, the beam projector 260 projects a light beam B which includes an image, and the reflection mirror 270 reflects the light beam B onto the inner wall 110*a* of the housing 110.

When the inspection target lies on the moving table 121 for an MRI scan, before the MRI scan starts, the beam projector 260 is mounted on one of the first and second detachable submodules 250-1 and 250-2 that is adjacent to the head of the inspection target. Similarly, the reflection mirror 270 is mounted on one of the first and second reflection mirror detachable devices 271 and 272 that is adjacent to the head of the inspection target. FIG. 17 illustrates a case in which the first detachable submodule 250-1 and the first reflection mirror detachable device 271 are adjacent to the head of the inspection target.

When an MRI scan starts, the moving table 121 enters the bore of the housing 110. Because the reflection mirror 270 is disposed on the moving table 121, the reflection mirror 270 enters the bore of the housing 110 as the moving table 121 is moved. Because the beam projector 260 is mounted on the support 122, even when the moving table 121 enters the bore of the housing 110, the beam projector 260 is still positioned outside the bore of the housing 110.

The beam projector 260 starts image projection at the moment when the head of the inspection target enters the bore of the housing 110, immediately before the head of the inspection target enters the bore of the housing 110, or immediately after the head of the inspection target enters the bore of the housing 110. Alternatively, the point of time when the beam projector 260 starts image projection may be set to be a point of time when the moving table 121 enters the bore of the housing 110, regardless of the location of the head of the inspection target.

Because the reflection mirror 270 is disposed on the moving table 121, an image that is reflected by the reflection mirror 270 and formed on the inner wall 110*a* of the housing 110 is moved as the moving table 121 is moved. The beam projector 260 may project a collimated light beam B which has an infinite focus. In this case, even when a distance between the reflection mirror 270 and the beam projector 260 is changed due to a movement 126 of the moving table 121, the focus of an image formed on the inner wall 110*a* of the housing 110 by the reflection mirror 270 may be maintained without change, regardless of the movement 126 of the moving table 121.

Figure 19:
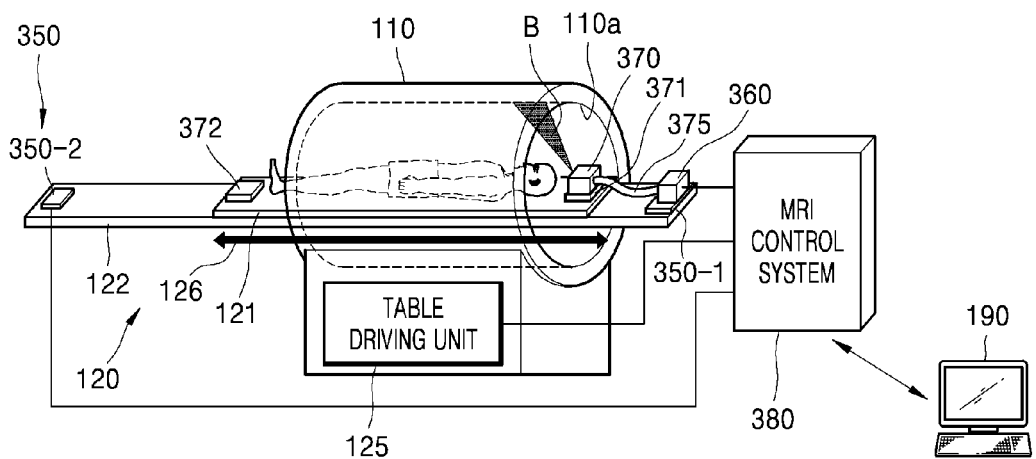
FIG. 19 is a schematic diagram of an MRI apparatus, according to another exemplary embodiment.

FIG. 19 is a schematic view of an MRI apparatus 300, according to another exemplary embodiment.

Referring to FIG. 19, in the MRI apparatus 300, a projection lens unit 370 is installed on the moving table 121, which is movable into the bore of the housing 110, and a video unit 360 is located outside the bore of the housing 110. The video unit 360 and the projection lens unit 370 are connected to each other via an optical fiber cable 375. The optical fiber cable 375 is flexible, and thus, even when a distance between the video unit 360 and the projection lens unit 370 is changed due to a movement of the moving table 121, the video unit 360 and the projection lens unit 370 may be optically connected to each other. The video unit 360, the optical fiber cable 375, and the projection lens unit 370 constitute a well-known optical fiber projector.

As illustrated in FIG. 19, the video unit 360 may be installed on the support 122, which movably supports the moving table 121. Similarly as described above with respect to the previous exemplary embodiments, because the direction in which an inspection target lies may be changed, first and second projection lens unit detachable devices 371 and 372, to and from which the projection lens unit 370 is attachable and detachable, may be respectively installed on both opposite ends of the moving table 121 such that they are adjacent to the respective locations where the head of the inspection target can be placed. First and second video unit detachable submodules 350-1 and 350-2, to and from which the video unit 360 is attachable and detachable, may be respectively installed on both opposite ends of the support 122. The video unit 360, which produces an image outside the bore of the housing 110, the first and second video unit detachable submodules 350-1 and 350-2, to and from which the video unit 360 is attachable and detachable, the projection lens unit 370, which projects light beams produced by the video unit 360 to the inner wall 110*a* of the housing 110, and an MRI control system 380 constitute an in-bore display device.

Similarly as described above with respect to the previous exemplary embodiments, the first video unit detachable submodule 350-1 and the second video unit detachable submodule 350-2 may not only have the video unit 360 attach thereto and detach therefrom, but also may perform a function of a connector via which power, a video signal, and a control signal which is supplied from the MRI control system 380 are transmitted to the video unit 360. Moreover, each of the first video unit detachable submodule 350-1 and the second video unit detachable submodule 350-2 may include the detachable sensor 153 of FIG. 4 in order to sense an attachment or a detachment of the video unit 360, and thus may transmit information which relates to the attachment or detachment of the video unit 360 to the MRI control system 380. Although the video unit detachable module 350 includes both the video unit first detachable submodule 350-1 and the second video unit detachable submodule 350-2 in the present exemplary embodiment, the present inventive concept is not limited thereto.

Each of the first and second projection lens unit detachable devices 371 and 372 may include a rotatable structure that is manually or automatically rotatable in any direction in a similar way to the rotating way of the rotating unit 1502 of the detachable module 150' of FIG. 11. Accordingly, each of the first and second projection lens unit detachable devices 371 and 372 may manually or automatically control the angle of inclination such that the direction in which the projection lens unit 370 projects an image is consistent with the direction that the inspection target faces.

Figure 20:
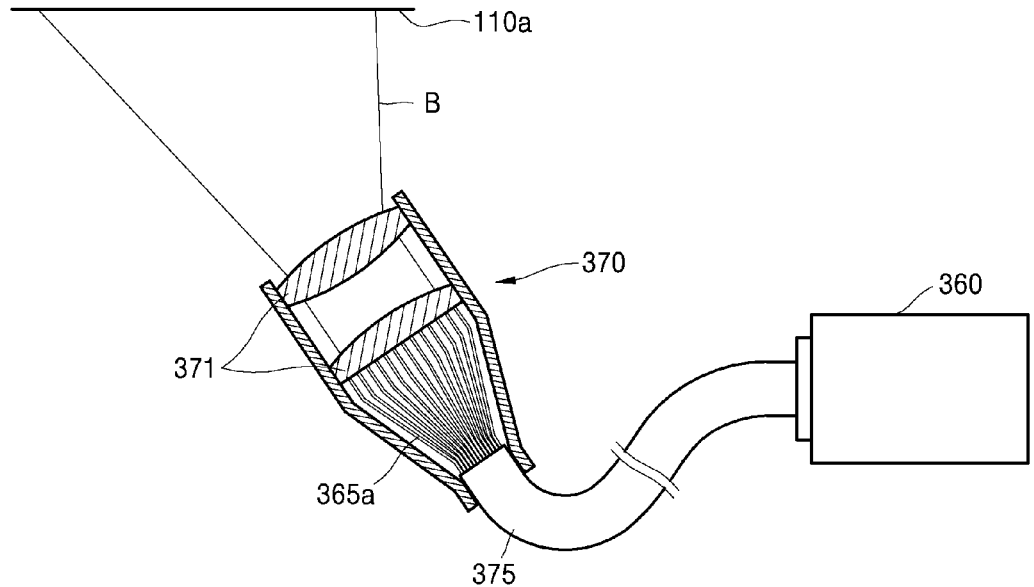
FIG. 20 is a schematic diagram of an optical fiber projector of the MRI apparatus of FIG. 19.

FIG. 20 is a schematic view of an optical fiber projector of the MRI apparatus 300 of FIG. 19.

Referring to FIG. 20, when the inspection target lies on the moving table 121 for an MRI scan, before the MRI scan starts, the video unit 360 is mounted on one of the first and second video unit detachable submodules 350-1 and 350-2 that is adjacent to the head of the inspection target. Similarly, the projection lens unit 370 is mounted on one of the first and second projection lens detachable devices 371 and 372 that is adjacent to the head of the inspection target. FIG. 20 illustrates a case in which the first video unit detachable submodule 350-1 and the first projection lens unit detachable device 371 are adjacent to the head of the inspection target.

When an MRI scan starts, the moving table 121 enters the bore of the housing 110. Because the projection lens unit 370 is disposed on the moving table 121, the projection lens unit 270 enters the bore of the housing 110 as the moving table 121 is moved. Because the video unit 360 is mounted on the support 122, even when the moving table 121 enters the bore of the housing 110, the video unit 360 is still positioned outside the bore of the housing 110.

The video unit 360 starts image projection at the moment when the head of the inspection target enters the bore of the housing 110, immediately before the head of the inspection target enters the bore of the housing 110, or immediately after the head of the inspection target enters the bore of the housing 110. Alternatively, the point of time when the video unit 360 starts image projection may be set to be a point of time when the moving table 121 enters the bore of the housing 110, regardless of the location of the head of the inspection target.

The video unit 360 produces an image and transmits a light beam which includes the image to the projection lens unit 370 via the optical fiber cable 375. The optical fiber cable 375 includes a plurality of optical fibers 365a, and the optical fibers 365a may be installed on an output end of the video unit 360 and an input end of the projection lens unit 370 in the same arrangement. Accordingly, the optical fibers 365a of the optical fiber cable 375 transmit a light beam B of the image which is produced by the video unit 360 to the projection lens unit 370, while maintaining the image. The light beam B of the image which is transmitted to the projection lens unit 370 is projected to the inner wall 110a of the housing 110 via projection lenses 371. Because the projection lens unit 370 is disposed on the moving table 121, an image that is projected by the projection lens unit 370 and formed on the inner wall 110a of the housing 110 is moved as the moving table 121 is moved.

According to the present exemplary embodiment, because an optical fiber projector method is used and the video unit 360 may be disposed outside the bore of the housing 110, the video unit 360 is relatively free from the influence of a magnetic field and an electric field within the bore of the housing 110. Because the projection lens unit 370 is formed of optical components that are unaffected by an electromagnetic field, the in-bore display device according to the present exemplary embodiment does not need to have a strict electromagnetic field shield, and therefore, may be designed more freely.

The MRI apparatuses 100, 100', 100'', 200, and 300 according to the above-described exemplary embodiments may enable an inspection target that is subjected to scanning to see various content (e.g., a moving picture, a picture, scanning state information (e.g., scan time information, scan guide information, and scanned area information), and information for use in MRI), and may display high-quality images by displaying an image within the bore by implementation of a projection method.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A magnetic resonance imaging (MRI) apparatus comprising:
a housing which includes a bore which is configured to receive an applied magnetic field for use in an MRI scan;
a moving table which is configured to provide for a placement of a patient and to enter the bore of the housing;
a projector which is configured to project an image into the bore of the housing; and
a controller which is configured to control the projector and to transmit a video signal to the projector,
wherein the projector comprises a light source driver which is configured to supply a voltage power to a light source, and
the light source driver comprises no inductors.

2. The MRI apparatus of claim 1, wherein the projector is further configured to project the image onto an inner wall of the housing which at least partially forms the bore of the housing, and the inner wall of the housing is curved into a substantially cylindrical formation.

3. The MRI apparatus of claim 1, wherein at least a part of an inner wall of the housing is flat, and the projector is further configured to project an image onto the flat at least the part of the inner wall.

4. The MRI apparatus of claim 1, further comprising a correction processor which is configured to process a signal which relates to the image that is to be projected by the projector, such that a distortion of the image due to a curvature and/or a slanting of an inner wall of the housing is substantially offset as a result of the signal processing.

5. The MRI apparatus of claim 1, wherein the projector comprises a projection direction converter which is configured to automatically convert a direction in which the projector projects the image.

6. The MRI apparatus of claim 1, wherein the projector is further configured to project the image onto an inner wall of the housing which at least partially forms the bore of the housing, and a location on the inner wall of the housing at which the image is projected changes based on a location of the moving table within the bore of the housing when the moving table enters the bore of the housing.

7. The MRI apparatus of claim 1, wherein the projector comprises an illumination sensor which is configured to control a beam brightness of the image which is projected by the projector based on a state of an illuminance within the bore.

8. The MRI apparatus of claim 1, wherein at least a part of the projector is mounted on the moving table.

9. The MRI apparatus of claim 1, wherein the projector comprises a beam projector which is disposed on at least one end of the moving table with respect to a longitudinal direction of the moving table.

10. The MRI apparatus of claim 9, wherein the projector further comprises a detachable module which is mounted on the moving table and to which the beam projector is detachably coupled.

11. The MRI apparatus of claim 10, wherein the detachable module comprises a first detachable submodule and a second detachable submodule, wherein the first detachable submodule is disposed on a first end of the moving table with respect to the longitudinal direction and the second detachable submodule is disposed on a second end of the moving table which is opposite to the first end of the moving table with respect to the longitudinal direction.

12. The MRI apparatus of claim 11, wherein
each of the first detachable submodule and the second detachable submodule comprises a respective connection terminal which is configured to transmit power and a video signal which is received from the controller to the beam projector, and a respective detachable sensor which is configured to sense an attachment or a detachment of the beam projector, and
the controller is further configured to supply the power and the video signal to only a submodule to which the beam projector is attached from among the first detachable submodule and the second detachable submodule, based on respective information which relates to the respective attachment or the respective detachment of the beam projector sensed by each respective detachable sensor.

13. The MRI apparatus of claim 10, wherein the detachable module comprises a projection direction converter which is configured to convert a direction in which the projector projects the image.

14. The MRI apparatus of claim 9, wherein
the light source driver comprises:
an adjustable regulator which is configured to transform an input power into a preset constant voltage and to output the preset constant voltage, the adjustable regulator comprising no inductors;
a constant voltage controller which is configured to control an outputting of the constant voltage power which corresponds to the preset constant voltage output by the adjustable regulator; and
a current sensor which is configured to sense a current which is supplied to the light source and to transmit information which relates to a magnitude of the sensed current to the constant voltage controller.

15. A method for displaying an image within a bore of a magnetic resonance imaging (MRI) apparatus, the method comprising:
causing a moving table on which a patient lies to enter into a bore of a housing to which a magnetic field for use in an MRI scan is applied; and
projecting an image by a projector into the bore of the housing,
wherein the projector comprises a light source driver which is configured to supply a voltage power to a light source, and
the light source driver comprises no inductors.

16. The method of claim 15, further comprising offsetting a distortion of the projected image which distortion is due to a curvature and/or a slanting of an inner wall of the housing by performing signal processing with respect to a signal which relates to the image.

17. The method of claim 15, wherein the projecting the image into the bore of the housing comprises starting the projecting at a point of time when the moving table enters the bore of the housing.

18. The method of claim 15, wherein the projecting the image into the bore of the housing comprises starting the projecting at a point of time when a head of the patient enters the bore of the housing.

19. The method of claim 15, wherein a point of time when the image is projected into the bore of the housing varies with respect to a selection between a first arrangement in which a head of the patient is oriented towards the bore of the housing and a second arrangement in which legs of the patient are oriented towards the bore of the housing.

20. The method of claim 15, further comprising automatically changing a direction in which the image is projected, based on at least one from among a posture and a facing direction of the patient.

21. The method of claim 15, wherein the projector is configured to project the image onto an inner wall of the housing which at least partially forms the bore of the housing, and a location on the inner wall of the housing at which the image is projected changes based on a location of the moving table within the bore of the housing when the moving table enters the bore of the housing.

22. The method of claim 15, wherein a beam brightness of the projected image is controllable based on a state of an illuminance within the bore.

23. A magnetic resonance imaging (MRI) apparatus comprising:
a housing which includes a bore which is configured to receive an applied magnetic field for use in an MRI scan of a patient;
a projector which is configured to receive a video signal which includes at least one image to be viewed by the patient of the MRI scan and to project the at least one image into the bore of the housing; and
a controller which is configured to control the projector based on at least one of a posture and a facing direction of the patient of the MRI scan,
wherein the projector comprises a light source driver which is configured to supply a voltage power to a light source, and
the light source driver comprises no inductors.

24. The MRI apparatus of claim 23, wherein the controller is further configured to control the projector based on a contour of a portion of an inner wall of the housing onto which the at least one image is projected.

25. The MRI apparatus of claim 23, wherein the controller is further configured to automatically control the projector based on a movement of the patient within the bore of the housing.

26. The MRI apparatus of claim 23, wherein the projector comprises an illuminance sensor which is configured to sense a state of an illuminance within the bore and to control a brightness of the projected at least one image based on the sensed state of the illuminance.

27. A method for displaying an image within a bore of a magnetic resonance imaging (MRI) apparatus, the method comprising:
providing a video signal which includes at least one image to be viewed by a patient of an MRI scan to a projector which is coupled to the MRI apparatus; and
controlling the projector to project the at least one image into the bore of the housing, based on at least one of a posture and a facing direction of the patient of the MRI scan,
wherein the projector comprises a light source driver which is configured to supply a voltage power to a light source, and
the light source driver comprises no inductors.

28. The method of claim 27, wherein the controlling further comprises controlling the projector based on a contour of a portion of an inner wall of the housing onto which the at least one image is projected.

29. The method of claim 27, wherein the controlling further comprises automatically controlling the projector based on a movement of the patient within the bore of the housing.

30. The method of claim 27, further comprising sensing a state of an illuminance within the bore and controlling a brightness of the projected at least one image based on the sensed state of the illuminance.

* * * * *